United States Patent
Hsieh et al.

(10) Patent No.: US 9,640,733 B2
(45) Date of Patent: May 2, 2017

(54) CARRIER, CARRIER LEADFRAME, AND LIGHT EMITTING DEVICE

(71) Applicant: Everlight Electronics Co., Ltd., New Taipei (TW)

(72) Inventors: Chung-Chuan Hsieh, New Taipei (TW); Yung Chieh Chen, New Taipei (TW)

(73) Assignee: Everlight Electronics Co., Ltd. (TW)

( * ) Notice: Subject to any disclaimer, the term of this patent is extended or adjusted under 35 U.S.C. 154(b) by 0 days.

(21) Appl. No.: 14/720,230

(22) Filed: May 22, 2015

(65) Prior Publication Data

US 2015/0340568 A1 Nov. 26, 2015

(30) Foreign Application Priority Data

May 23, 2014 (TW) .............................. 103118060 A
Feb. 3, 2015 (TW) .............................. 104103527 A

(51) Int. Cl.
*H01L 33/48* (2010.01)
*H01L 33/62* (2010.01)
(Continued)

(52) U.S. Cl.
CPC ............ *H01L 33/483* (2013.01); *H01L 24/97* (2013.01); *H01L 33/62* (2013.01); *H01L 33/60* (2013.01);
(Continued)

(58) Field of Classification Search
None
See application file for complete search history.

(56) References Cited

U.S. PATENT DOCUMENTS 8,137,999 B2 * 3/2012 Wang .................... H01L 33/486
257/E21.499
9,024,514 B2 * 5/2015 Kato ...................... H05B 33/06
257/99
(Continued)

FOREIGN PATENT DOCUMENTS

CN 101346584 A 1/2009
JP 2014017460 A 1/2014
(Continued)

*Primary Examiner* — Ali Naraghi
(74) *Attorney, Agent, or Firm* — Han IP Corporation; Andy M. Han

(57) ABSTRACT

A carrier leadframe, including a frame body and a carrier, is provided. The frame body includes at least one supporting portion, and the carrier includes a shell and at least one electrode portion and is mechanically engaged with the frame body via the supporting portion. A method for manufacturing the carrier leadframe as described above, as well as a light emitting device made from the carrier leadframe and a method for manufacturing the device, are also provided. The carrier leadframe has carriers that are separate in advance and mechanically engaged with the frame body, thereby facilitating the quick release of material after encapsulation. Besides, in the carrier leadframe as provided, each carrier is electrically isolated from another carrier, so the electric measurement can be performed before the release of material. Therefore, the speed and yield of production of the light emitting device made from the carrier leadframe is improved.

12 Claims, 28 Drawing Sheets

(51) Int. Cl.
*H01L 23/00* (2006.01)
*H01L 33/60* (2010.01)
(52) U.S. Cl.
CPC ............. *H01L 2933/0033* (2013.01); *H01L 2933/0066* (2013.01)

(56) References Cited

U.S. PATENT DOCUMENTS

| | | | | |
|---|---|---|---|---|
| 2007/0246841 | A1* | 10/2007 | Yamamoto | B29C 45/14639 257/784 |
| 2007/0261374 | A1* | 11/2007 | Nelson | B01D 46/0004 55/434 |
| 2009/0261374 | A1* | 10/2009 | Hayashi | H01L 33/62 257/99 |
| 2012/0132949 | A1* | 5/2012 | Watari | H01L 33/54 257/99 |
| 2013/0270588 | A1* | 10/2013 | Wang | H01L 33/62 257/91 |

FOREIGN PATENT DOCUMENTS

| | | |
|---|---|---|
| JP | 2014060343 A | 4/2014 |
| KR | 3020070049380 | 11/2007 |
| KR | 20100083907 A | 7/2010 |
| TW | D149221 | 9/2012 |
| TW | D154432 | 7/2013 |
| TW | D1154430 | 7/2013 |
| TW | 201340410 A | 10/2013 |

* cited by examiner

CARRIER, CARRIER LEADFRAME, AND LIGHT EMITTING DEVICE

CROSS-REFERENCE TO RELATED APPLICATIONS

This application claims the priority benefit of Taiwan Patent Application No. 103118060, filed on May 23, 2014, and Taiwan Patent Application No. 104103527, filed on Feb. 3, 2015, both of which are incorporated herein by reference in their entirety.

TECHNICAL FIELD

The present disclosure relates to a carrier leadframe and a light emitting device made from the carrier leadframe. More particularly, the present disclosure relates to a carrier leadframe for receiving a light emitting diode (LED) chip and a light emitting device made from the leadframe.

BACKGROUND

Unless otherwise indicated herein, approaches described in this section are not prior art to the claims listed below and are not admitted to be prior art by inclusion in this section.

Light emitting diodes (LEDs) have such advantages as a long service life, a small volume, high resistance to shock, low heat generation and low power consumption, so they have been widely used as indicators or light sources in household appliances and various other appliances. In recent years, LEDs have developed towards multicolor and high brightness, so applications thereof have been extended to large-sized outdoor signboards, traffic signal lamps and related fields. In the future, it is even possible that the LEDs become mainstream illumination light sources having both power-saving and environmental protection functions. To impart the LEDs with good reliability, most of the LEDs are subjected to a packaging process to form durable light emitting devices.

In recent years, a dicing-type carrier leadframe has been developed by manufacturers in the art to which the present disclosure belongs. Specifically, a plastic body is molded on a metal sheet material, then a die bonding process, a wire bonding process and an encapsulation process are performed, and then the metal sheet material and the plastic body are diced away simultaneously to form individual light emitting devices that are separate from each other. However, a large amount of plastic and metal dusts tend to be produced during the dicing process, which seriously pollute the surfaces of the final products and thus degrade the reliability of the products. Additionally, this process does not allow for a light-on test prior to the encapsulation process, and measurements can only be made after the products are singulated. However, the final products that have been singulated are piled randomly, and machine measurements on them can only be made after surface orientation and direction adjustment. This requires use of additional instruments and is time consuming.

SUMMARY

The following summary is for illustrative purpose only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

In view of the aforesaid problems, the present invention provides a carrier and a carrier leadframe, which has at least one carrier that is separated in advance and mechanically engaged with the leadframe, thereby facilitating quick release of material after die bonding, wire bonding and encapsulation. Besides, in the carrier leadframe of the present invention, each carrier is electrically isolated from other carriers, so after LEDs are die bonded and wire bonded to the carriers, the electric measurement can be performed before the release of material. Furthermore, a light emitting device made from the carrier leadframe is also provided in the present invention, and with the advantages of the aforesaid carrier leadframe, the production speed and yield of the light emitting device can be greatly improved.

BRIEF DESCRIPTION OF THE DRAWINGS

The accompanying drawings are included to provide a further understanding of the disclosure, and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

A carrier leadframe of the present invention comprises a frame body and a carrier, and the carrier includes a housing and at least one electrode portion. In the present invention, the frame body includes at least one supporting portion and is mechanically engaged with the carrier so that the carrier is supported on the frame body. In a specific embodiment of the present invention, the housing may have a concave portion mating with the supporting portion, and the carrier is supported on the frame body through the engagement between the supporting portion and the concave portion. The position of the concave portion is not particularly limited in the present invention, and the concave portion may be located at a side surface or at the border between a bottom surface and the side surface of the carrier. The supporting portion goes deep into the carrier or is only positioned on the bottom surface of the carrier with a half thereof being exposed outside.

Figure 1:
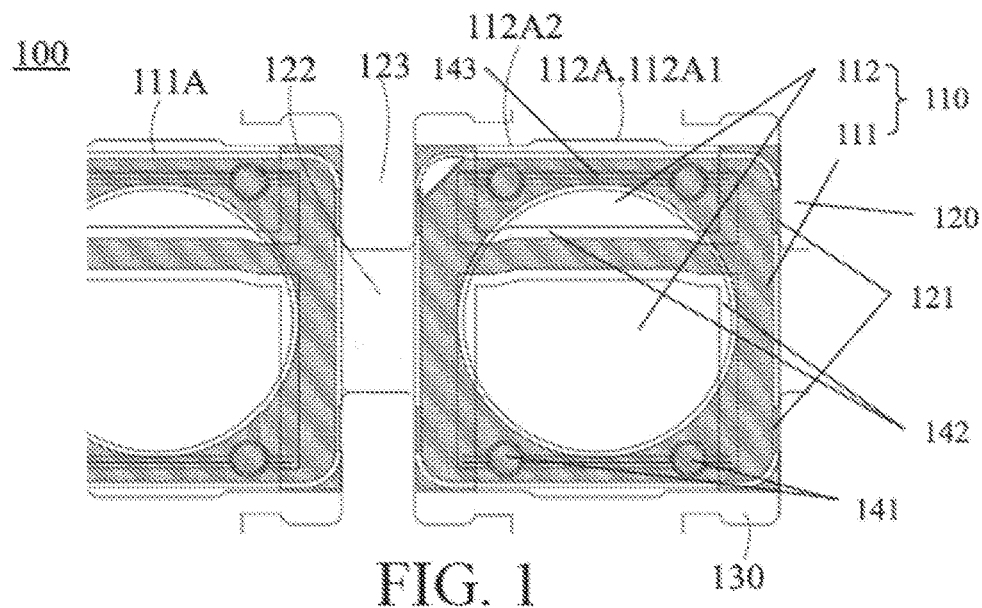
FIG. 1 is a partial schematic view of an embodiment of a carrier leadframe according to the present disclosure.

FIG. 1 is a partial schematic view of an embodiment of a carrier leadframe according to the present disclosure. As shown in FIG. 1, a carrier leadframe 100 comprises a carrier 110 and a frame body 120, and the carrier 110 comprises a housing 111 and two electrode portions 112. The frame body 120 comprises a plurality of supporting portions 121. As shown in FIG. 1, the frame body 120 beneath the carrier leadframe 100 comprises four supporting portions 121, and four concave portions are formed at the border between the side surfaces and the bottom surface of the housing 111 (corresponding to positions of the supporting portions 121) so that each of the four supporting portions 121 is positioned on the bottom surface of the carrier 110 with a half thereof being exposed outside. In an embodiment, the carrier 110 further comprises a reflection concave cup to expose a part of each of the electrode portions 112. The electrode portion 112 extends outwardly from the reflection concave cup through the housing 111 to the outside.

Figure 3:
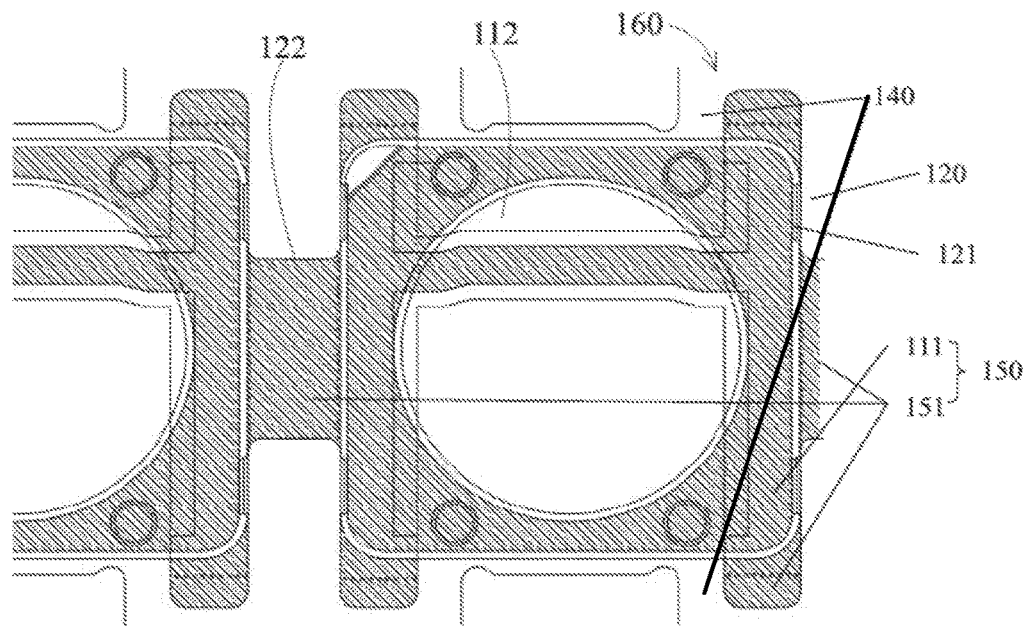
FIG. 3 is a partial schematic view of the carrier leadframe of FIG. 1 after a plastic body is formed.

The frame body 120 may also have a runner area 122 and a side portion 123, and the runner area 122 is disposed on the side portion 123. The runner area 122 is a through area that allows a plastic body 150 (as shown in FIG. 3) to be described later to flow therethrough, and the supporting portion 121 is disposed also on the side portion 123.

Additionally, each of the electrode portions 112 may also be formed with pinholes, grooves (linear slits on the surface of the electrode portion) and steps in the present disclosure. The mechanical binding force between the housing and the electrode portion of the carrier can be increased due to the pinholes, the grooves and the steps. As shown in FIG. 1, each of the two electrode portions 112 in the carrier 110 comprises two pinholes 141 and three grooves 143, and steps 142 are provided on edges of the two electrode portions 112 that are surrounded by the housing 111, thereby increasing the binding strength between the housing 111 and the electrode portions 112.

Each carrier in the carrier leadframe of the present disclosure is supported on the frame body via the mechanical engagement between the concave portion and the supporting portion, and the electrode portions of different carriers are electrically isolated from each other. Thus, after the die bonding process, the wire bonding process and the encapsulation process subsequently performed on the light emitting devices, the electric measurement can be made on the light emitting devices that have not been singulated (i.e., the light emitting devices that are still supported on the frame body in a regular way). Since the light emitting devices are arranged regularly, equipment and time required for surface orientation and direction adjustment are eliminated and the production speed of the light emitting devices can be greatly improved.

The carrier leadframe of the present disclosure may be manufactured in the following way. First, a conductive sheet is provided. The conductive sheet comprises a frame body, at least one void area and at least one extending portion, and the frame body comprises at least one supporting portion. Then, a plastic body is formed on the conductive sheet to cover at least a part of the extending portion and at least a part of the supporting portion and to fill at least a part of the void area. Subsequently, the part of the extending portion exposed outside the housing and a part of the plastic body filled within the void area are respectively removed so as to form the carrier. In particular, after the two removing steps, the housing of the carrier is formed by the remaining plastic body, and the electrode portion of the carrier is formed by the extending portion remaining on the plastic body.

Figure 2:
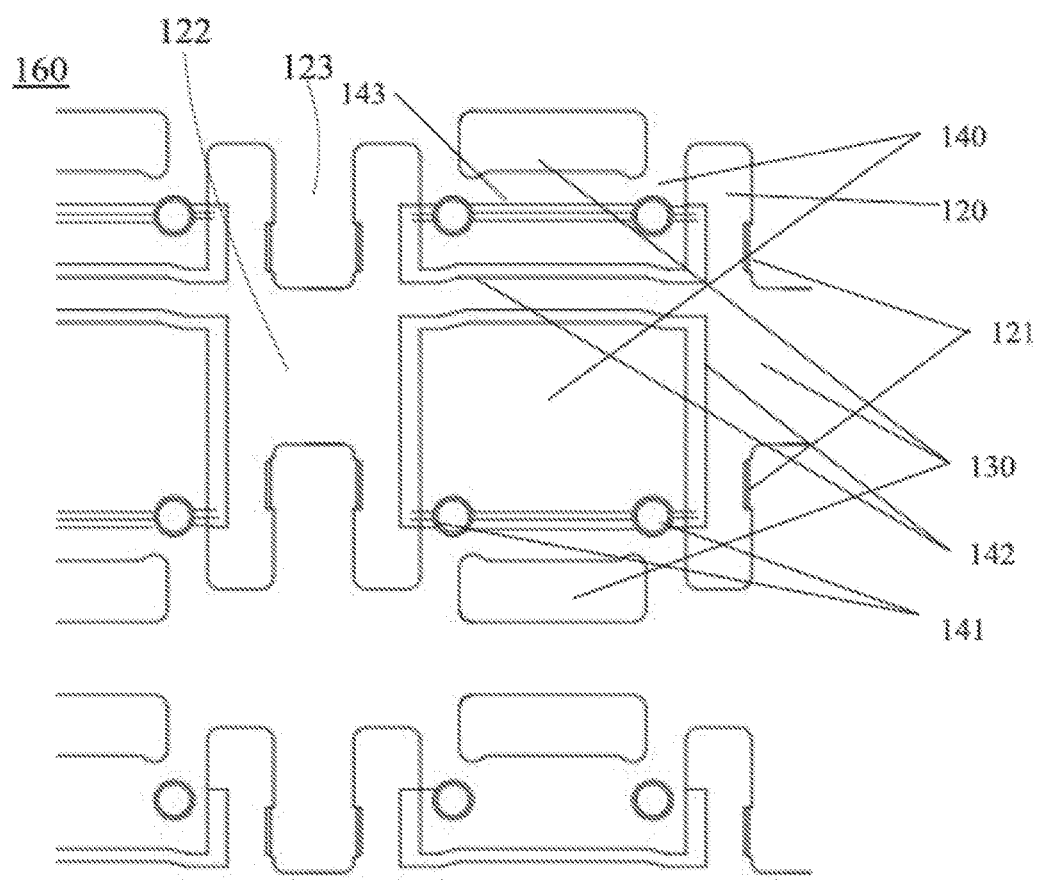
FIG. 2 is a partial schematic view of a conductive sheet used in the carrier leadframe of FIG. 1.
Figure 4:
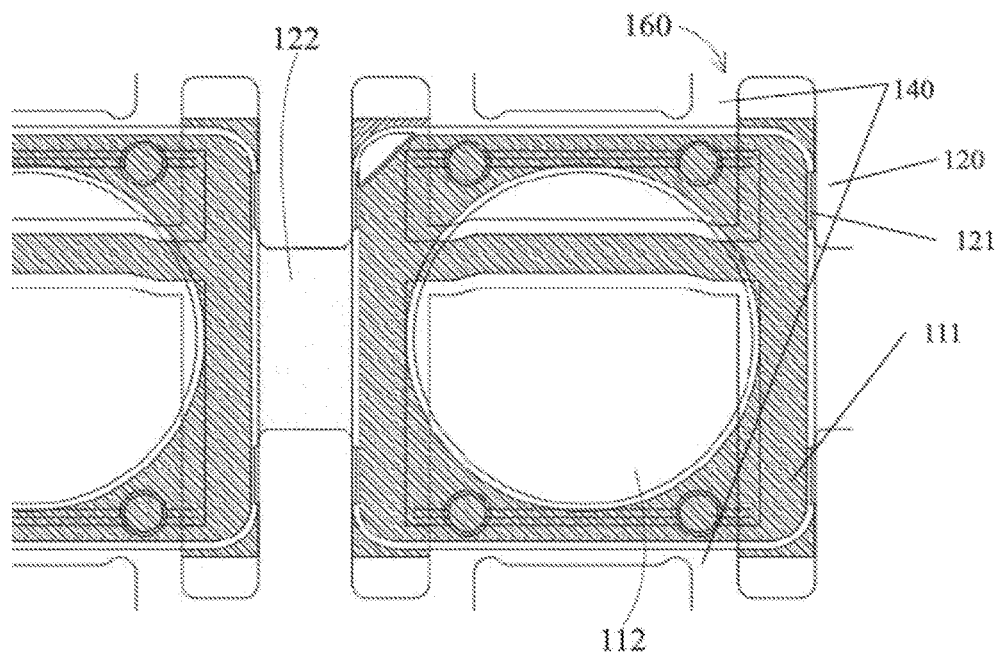
FIG. 4 and FIG. 4A are partial schematic views of the carrier leadframe of FIG. 1 after the residual material is removed.
Figure 4A:
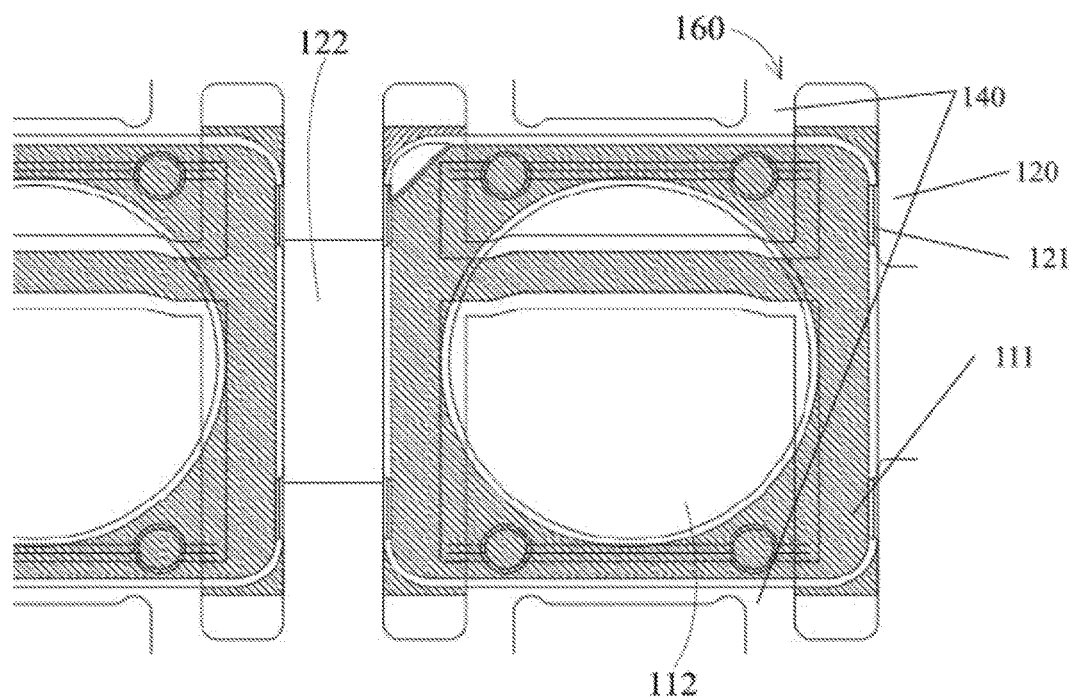

Hereinafter, the manufacturing process of the carrier leadframe 100 of FIG. 1 will be detailed with reference to FIG. 2 to FIG. 4. First, a conductive sheet 160 as shown in FIG. 2 is provided. The conductive sheet 160 comprises a frame body 120, a plurality of void areas 130 and a plurality of extending portions 140. The frame body 120 also comprises a plurality of supporting portions 121, and each of the extending portions 140 comprises a plurality of pinholes 141, grooves 143 and steps 142. Finally, the part of each of the extending portions 140 exposed outside the housing is removed to form the carrier leadframe 100 of FIG. 1.

In the present disclosure, the conductive sheet may be made of a metal sheet, including a pure metal sheet, an alloy sheet, and a metal composite sheet, and the composite sheet is preferably a metal sheet cladded with a conductive layer having a relatively high resistance to oxidation or a relatively high solder binding force (e.g., a silver-plated copper sheet, or the like). The frame body, the extending portion and the void portion are formed in an appropriate way. When the conductive sheet is made of a metal sheet, the frame body, the extending portion and the void portion may be preferably formed through a stamping process; however, they may also be formed through a dicing process or a mold casting process. Moreover, if the conductive sheet has insufficient conductivity, a conductive layer (not shown) may be formed on the conductive sheet after the conductive sheet is provided (the conductivity of the conductive layer is higher than that of the conductive sheet) so as to increase the reliability of the subsequent test. The material of the conductive layer may include materials having high conductivity (e.g., silver, or the like).

After the conductive sheet is provided, a plastic body is then formed on the conductive sheet. The way in which the plastic body is formed is not limited. For Example, the plastic body may be formed through transfer molding, injection molding, etc. The material of the plastic body is not limited. For example, it may be selected from plastic materials commonly used in this industry, e.g., epoxy compositions, silicon compositions, polyphthalamide compositions, or polyethylene terephthalate compositions. In a specific embodiment of the present disclosure, the plastic body is made of an epoxy composition through transfer molding. In another embodiment, the plastic body may be a thermosetting material and may further comprise a reflective material, e.g., titanium dioxide (TiO2), zinc oxide (ZnO) or boron nitride (BN).

Next, a plastic body 150 is formed on the conductive sheet 160 as shown in FIG. 3. The plastic body 150 covers a part of each of the extending portions 140 and completely covers all of the pinholes 141 and grooves 143. The plastic body 150 also fills a part of the void area 130 (the part of the void area 130 above and below the extending portion 140 is not filled) and completely covers all of the supporting portions 121. The plastic body 150 also fills the runner area 122 and is formed integrally with another adjacent plastic body 150.

Further speaking, during the formation of the plastic body 150 in the present disclosure, the material of the plastic body 150 will fill the mold cavity of the mold and the void area. In this step, the housing 111 and the residual material 151 are still held together. The scope of the residual material 151 is defined depending on the subsequent application of the product. As shown in FIG. 3, what denoted by dotted lines is the residual material 151 defined in this embodiment. Thereafter, the defined residual material 151 is removed as shown in FIG. 4, thereby forming the housing 111 of the carrier 110.

If the runner area 122 is filled with the plastic body 150, the residual material 151 may be removed in at least two steps, e.g., by firstly removing the residual material 151 filled in the runner area 122 and then removing the residual material 151 filled in the void area 130 or vice versa. This can simplify the arrangement of knives for removing the residual material 151 in each step so that the knives have sufficient distances therebetween and desirable strength.

Finally, the part of each of the extending portions 140 exposed outside the housing 111 is removed to form the carrier leadframe 100 as shown in FIG. 1. Before the part of each of the extending portions 140 is removed, the part of the frame body 120 at two sides of the runner area 122 may be removed optionally with a knife of a length larger than that of the runner area 122 so as to thoroughly remove the residual material 151 possibly left in the runner area 122; thus, the damage to the electrode portions 112 or the light emitting diode (LED) chips can be avoided by preventing the residual material 151 from falling off onto the electrode portions 112 or the LED chips. After the part of the frame body 120 at the two sides of the runner area 122 is removed, the length of the runner area 122 is increased as shown in FIG. 4B.

Therefore, the manufacturing method of this embodiment may optionally perform two or more removing steps on the conductive sheet 160 and may also perform two or more removing steps on the plastic body 150 (the residual material 151).

In the present disclosure, the residual material 151 and parts of the extending portions 140 are removed separately. In particular, the order in which the residual material 151 and the parts of the extending portions 140 are removed is not particularly limited as long as they are separately removed. For example, it may be that all the parts of the extending portions 140 are simultaneously removed after all the residual material 151 is simultaneously removed, or all the residual material 151 is removed after all the parts of the extending portions 140 are simultaneously removed, or part of the residual material 151 and parts of the extending portions 140 are removed alternately in different stages. The way in which the removing steps are performed is not limited, and the removing steps may be accomplished for example through a dicing process or a stamping process but preferably be accomplished through the stamping process.

The stamping process is taken as an example in the embodiments of the present disclosure.

The tools and the working strength can be adjusted depending on the mechanical properties of the parts to be removed in the present disclosure. In particular, the respective removing steps can avoid drawbacks resulting from removing different materials simultaneously, e.g., plane defects or damage to the removing tools (knives) due to non-uniform stresses. Additionally, dusts of the plastic body tend to be produced during the removal of the plastic body as compared to the removal of the extending portion. The dusts can only be removed by a strong external force, e.g., through strong air blowing, shaking, or ultrasonic waves. If the cleaning step is to be performed after the residual material and the extending portion are simultaneously removed, it is possible that the bonding force between the carrier and the frame body is insufficient to avoid falling off of the material. Thus, in the present disclosure, the cleaning step (i.e., the cleaning of the plastic body) is preferably performed after the residual material is removed and before the extending portion is removed. This can enhance the connection strength between the carrier and the leadframe by means of the extending portion so as to avoid falling off of the material during the cleaning step, and finally the extending portion is removed.

After the removing steps, at least one electrode portion cross section will be formed on the electrode portion of the carrier, and a housing cross section will be formed by the residual material on the housing of the carrier. In the present disclosure, the electrode portion cross section and the housing cross section may be located on a same surface or different surfaces of the carrier depending on the safety specification of the final product or depending on the customer requirements. Further speaking, when the electrode portion cross section and the housing cross section are located on the same surface of the carrier, the electrode portion cross section and the housing cross section may be level with each other (i.e., form a flat surface) or may not be level with each other (i.e., do not form a flat surface).

Figure 5:
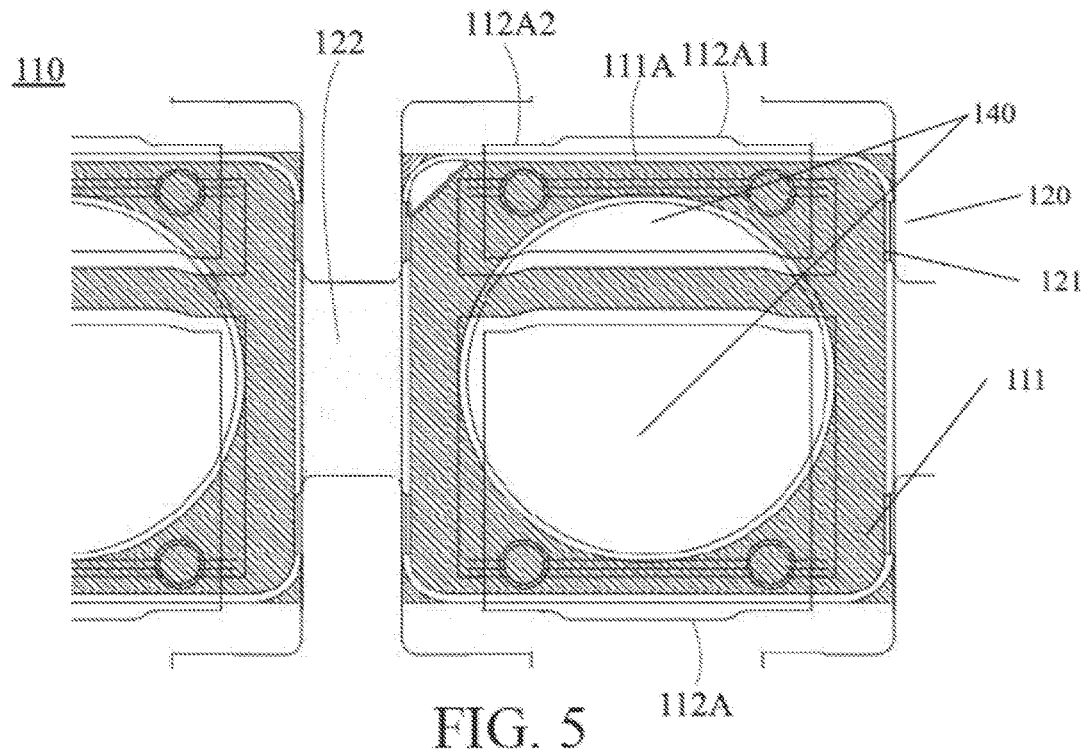
FIG. 5 is a partial schematic view of another embodiment of the carrier leadframe according to the present disclosure.

As shown in FIG. 1, the electrode portion 112 has a wing portion 112A exposed outside the housing, and the wing portion 112A comprises a central protruding area (or called central area) 112A1 and two outer edge areas (or called edge areas) 112A2. In the embodiment of FIG. 1, each of the edge areas 112A2 comprises an electrode portion cross section, and the electrode portion cross sections are level with a part of the housing cross section 111A of the housing 111; and in this case, the carrier has a relatively flat appearance. However, as shown in FIG. 5, the wing portion 112A of the electrode portion 112 comprises a central protruding area 112A1 and two outer edge areas 112A2, and the electrode portion cross section of the electrode portion 112 is not level with the housing cross section 111A of the housing 111; and in this case, the electrode portion 112 has an additional lateral area that can increase the binding force with the solder so as to increase the component bonding strength of the light emitting devices after the subsequent component bonding process.

Moreover, in case where the conductive sheet is a metal composite sheet with an antioxidant layer, a cross section uncovered with the antioxidant layer will be formed on the electrode portion cross section. In the present disclosure, the cross section uncovered with the antioxidant layer is preferably formed integrally with the central area of the electrode portion. During the subsequent component bonding process, the solder may climb along the side surface of the wing portion and cover the side surface, and in this case, at least a part of the cross section uncovered with the antioxidant layer can be covered by the solder to reduce the probability that the cross section portion is oxidized. Additionally, the cross section uncovered with the antioxidant layer and the surface of the adjacent central area are at the same side, and preferably form a continuous surface so as to reduce sharp points or rough edges of the electrode portion. Otherwise, the sharp points or rough edges would cause wear of the subsequent processing machine, and what is worse, a charge accumulation effect might occur at the sharp points or the rough edges to influence the reliability of the finally product.

The present disclosure also provides a light emitting device made from the carrier leadframe of the present disclosure, and the light emitting device comprises a carrier, an LED chip and an encapsulant. The LED chip is carried within the carrier and covered by the encapsulant. The material of the encapsulant in the present disclosure may be a plastic composite of epoxy resins or silicone. Moreover, the light emitting device of the present disclosure may optionally have fluorescent materials added into the encapsulant, and examples of the fluorescent materials include: aluminate fluorescent materials (e.g., doped yttrium aluminum oxide compounds, doped lutetium aluminum oxide compounds, doped terbium aluminum oxide compounds, or combinations thereof), silicate fluorescent materials, sulfide fluorescent materials, oxynitride fluorescent materials, nitride fluorescent materials, fluoride fluorescent materials, or combinations thereof.

The light emitting device of the present disclosure may be manufactured in the following way. First, a carrier leadframe as described above is provided. Then, an LED chip is provided and die bonded and wire bonded into the reflection concave cup of the carrier. Thereafter, the reflection concave cup is filled with an encapsulant so as to encapsulate the LED chip to form a light emitting device on the frame body. Finally, the light emitting device is separated from the frame body (i.e., the carrier is separated from the frame body for example through extrusion) to form a separate light emitting device.

A plurality of LED chips may also be provided within the carrier in the present disclosure, and these LED chips can emit lights of the same or different spectrums. After the LED chips are fixed, the wire bonding process may be performed to electrically connect the LED chips with the electrode portion. Other electronic elements, e.g., a Zener diode or a thermistor, may also be provided depending on requirements of the final product.

Figure 6:
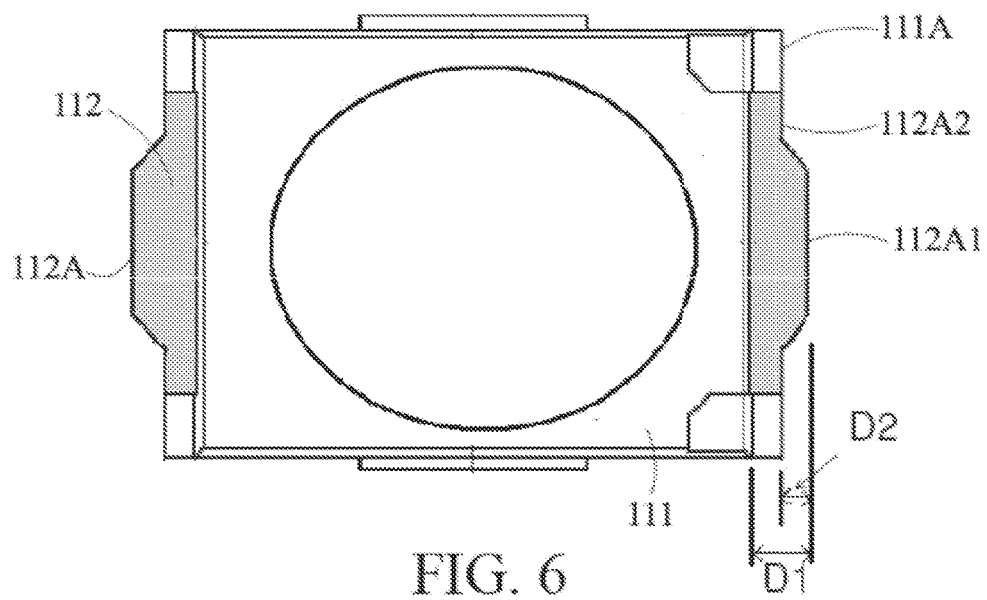
FIG. 6 is a top view of a light emitting device according to an embodiment of the present disclosure.

Referring to FIG. 6, a top view of a light emitting device according to an embodiment of the present disclosure is shown therein. The wing portion 112A of the electrode portion 112 has a central area 112A1 and two edge areas 112A2, and the central area 112A1 protrudes from the two edge areas 112A2. The wing portion 112A protrudes out of the housing cross section 111A of the housing 111 so that the central area 1112A1 of the wing portion 112A of the electrode portion 112 is not coplanar with the housing cross section 111A of the housing 111. An interval D1 is the distance between the central area of the wing portion 112A of the electrode portion 112 and the inner side of the housing cross section 111A of the housing 111, and the interval D1 is about 0.1 mm. An interval D2 is the distance between the central area 112A1 of the wing portion 112A of the electrode portion 112 and the outer side of the wing portion 112A of the housing 111 (i.e., the central area 112A1 of the wing portion 112A of the electrode portion 112 and the wing portion 112A of the housing 111), and the interval D2 is about 0.05 mm.

Figure 7:
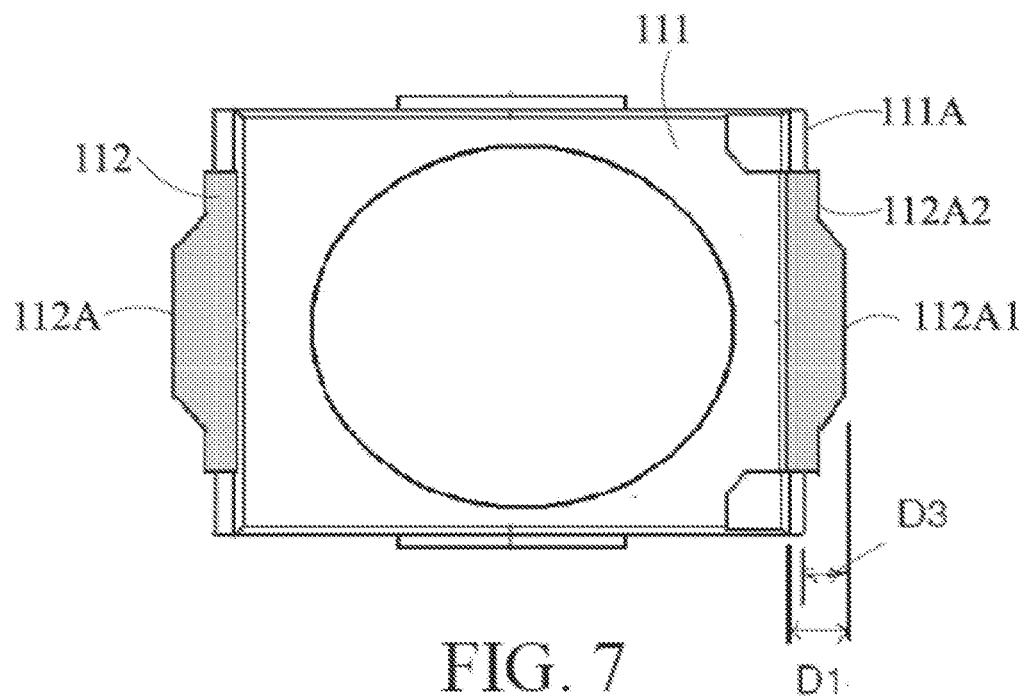
FIG. 7 is a top view of a light emitting device according to another embodiment of the present disclosure.

Referring to FIG. 7, a top view of a light emitting device according to another embodiment of the present disclosure is shown therein. The wing portion 112A of the electrode portion 112 has a central area 112A1 and two edge areas 112A2, and the wing portion 112A protrudes out of the housing cross section 111A of the housing 111 so that the wing portion 112A of the electrode portion 112 is not coplanar with the housing cross section 111A of the housing 111. The interval D1 is the distance between the central area of the wing portion 112A of the electrode portion 112 and the inner side of the housing cross section 111A of the housing 111, and the interval D1 is about 0.1 mm. An interval D3 is the distance between the central area 112A1 of the wing portion 112A of the electrode portion 112 and the outer side of the cross section 111A of the housing 111, and the interval D3 is about 0.075 mm.

Figure 8:
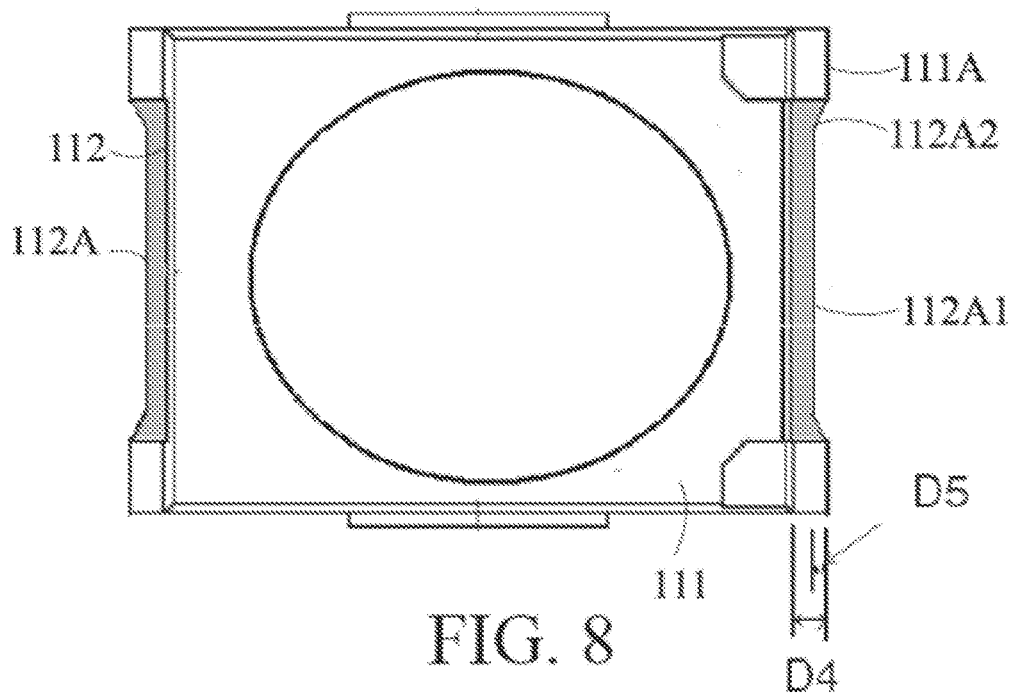
FIG. 8 is a top view of a light emitting device according to a further embodiment of the present disclosure.

Referring to FIG. 8, a top view of a light emitting device according to a further embodiment of the present disclosure is shown therein. The wing portion 112A of the electrode portion 112 has a central area 112A1 and two edge areas 112A2, the central area 112A1 is recessed from the two edge areas 112A2, and the electrode portion cross sections of the two edge areas 112A2 are sloping surfaces. The wing portion 112A is recessed into the cross section 111A of the housing 111 so that the wing portion 112A of the electrode portion 112 is not coplanar with the cross section 111A of the housing 111. An interval D4 is the distance between the outer side and the inner side of the cross section 111A of the housing 111, and the interval D4 is about 0.05 mm. An interval D5 is the distance between the central area of the wing portion 112A of the electrode portion 112 and the outer side of the cross section 111A of the housing 111, and the interval D5 is about 0.025 mm.

Figure 9:
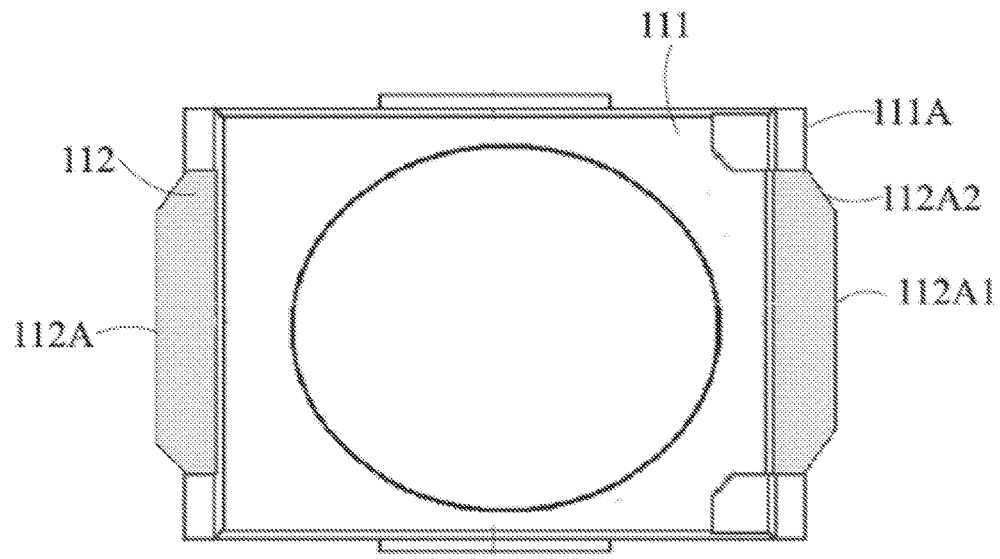
FIG. 9 is a top view of a light emitting device according to yet another embodiment of the present disclosure.

Referring to FIG. 9, a top view of a light emitting device according to yet another embodiment of the present disclosure is shown therein. The wing portion 112A of the electrode portion 112 has a central area 112A1 and two edge areas 112A2, the central area 112A1 protrudes out of the two edge areas 112A2, and the electrode portion cross sections of the two edge areas 112A2 are sloping surfaces. The wing portion 112A protrudes out of the cross section 111A of the housing 111 so that the wing portion 112A of the electrode portion 112 is not coplanar with the cross section 111A of the housing 111.

Figure 10:
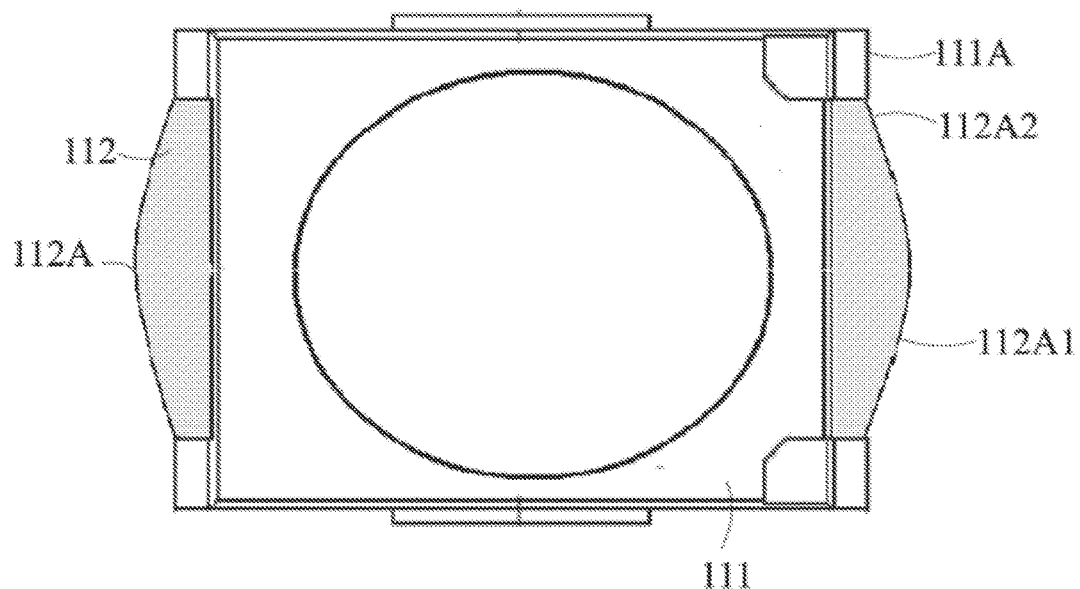
FIG. 10 is a top view of a light emitting device according to yet a further embodiment of the present disclosure.

Referring to FIG. 10, a top view of a light emitting device according to yet a further embodiment of the present disclosure is shown therein. The wing portion 112A of the electrode portion 112 is a convex curved surface, i.e., the external surface of the central area and the outline (the electrode portion cross sections) of the edge areas together form a continuous convex curved surface. The wing portion 112A protrudes out of the cross section 111A of the housing 111 so that the wing portion 112A of the electrode portion 112 is not coplanar with the cross section 111A of the housing 111.

Figure 11:
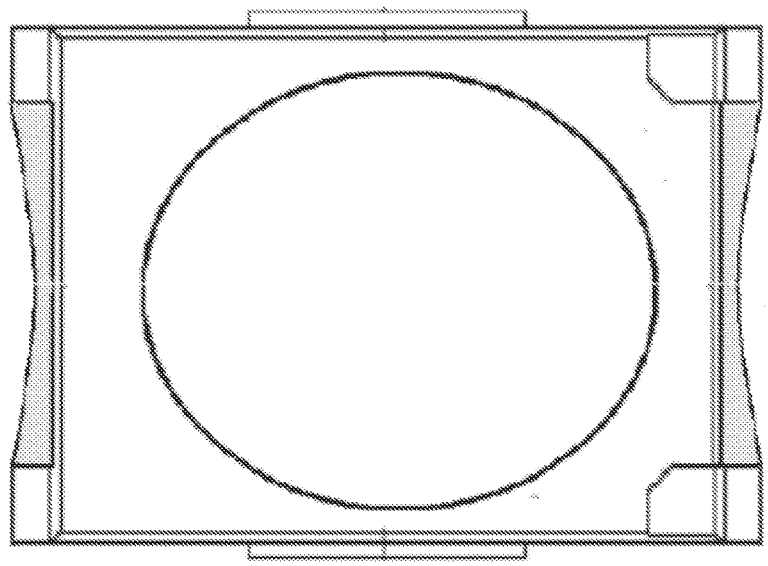
FIG. 11 is a top view of a light emitting device according to still another embodiment of the present disclosure.

Referring to FIG. 11, a top view of a light emitting device according to still another embodiment of the present disclosure is shown therein. The wing portion 112A of the electrode portion 112 is a concave curved surface, i.e., the external surface of the central area and the outline (the electrode portion cross sections) of the edge areas together form a continuous concave curved surface. The wing portion 112A is recessed into the cross section 111A of the housing 111 so that the wing portion 112A of the electrode portion 112 is not coplanar with the cross section 111A of the housing 111.

Referring to FIG. 12A to FIG. 12D, schematic views (i.e., a top view, a cross-sectional view taken along the front-to-back direction, a cross-sectional view taken along the left-to-right direction, and a partially enlarged view) of a carrier leadframe 100' according to an embodiment of the present disclosure are shown therein. The carrier leadframe 100' is similar to the aforesaid carrier leadframe 100. That is, the carrier leadframe 100' also comprises a frame body 120 and a carrier 110, the frame body 120 comprises at least one supporting portion 121, the carrier 110 comprises a housing 111 and at least one electrode portion 112, and the housing 111 is mechanically engaged with the frame body 120 via the supporting portion 121. Thus, for the technical contents of the aforesaid elements, reference may be made to the counterparts of the carrier leadframe 100.

Preferably, the at least one electrode 112 may be two electrode portions 112 spaced apart from each other to respectively serve as an anode terminal and a cathode terminal of the carrier 110. The two electrode portions 112 are surrounded by the frame body 120, i.e., the two electrode portions 112 are located within a space surrounded by the frame body 120 itself. The two electrode portions 112 may be separated from the frame body 120 by at least one void area 130 so that the two electrode portions 112 will not make contact with the frame body 120 and thus be electrically isolated from the frame body 120.

The supporting portion 121 of the frame body 120 extends towards one of the two electrode portions 112, but will not make contact with the electrode portion 112. In this embodiment, there are four supporting portions 121 that are distributed at two sides of the electrode portions 112. The housing 111 may at least cover the supporting portions 121 and at least a part of the two electrode portions 112, and is at least disposed within a part of the void area 130. Thereby, the housing 111 is mechanically engaged with the frame body 120 via the supporting portions 121, and the housing 111 is also mechanically engaged with the two electrode portions 112 so that the housing 111 and the two electrode portions 112 can be held within the frame body 120 without falling off from the frame body 120.

Figure 13A:
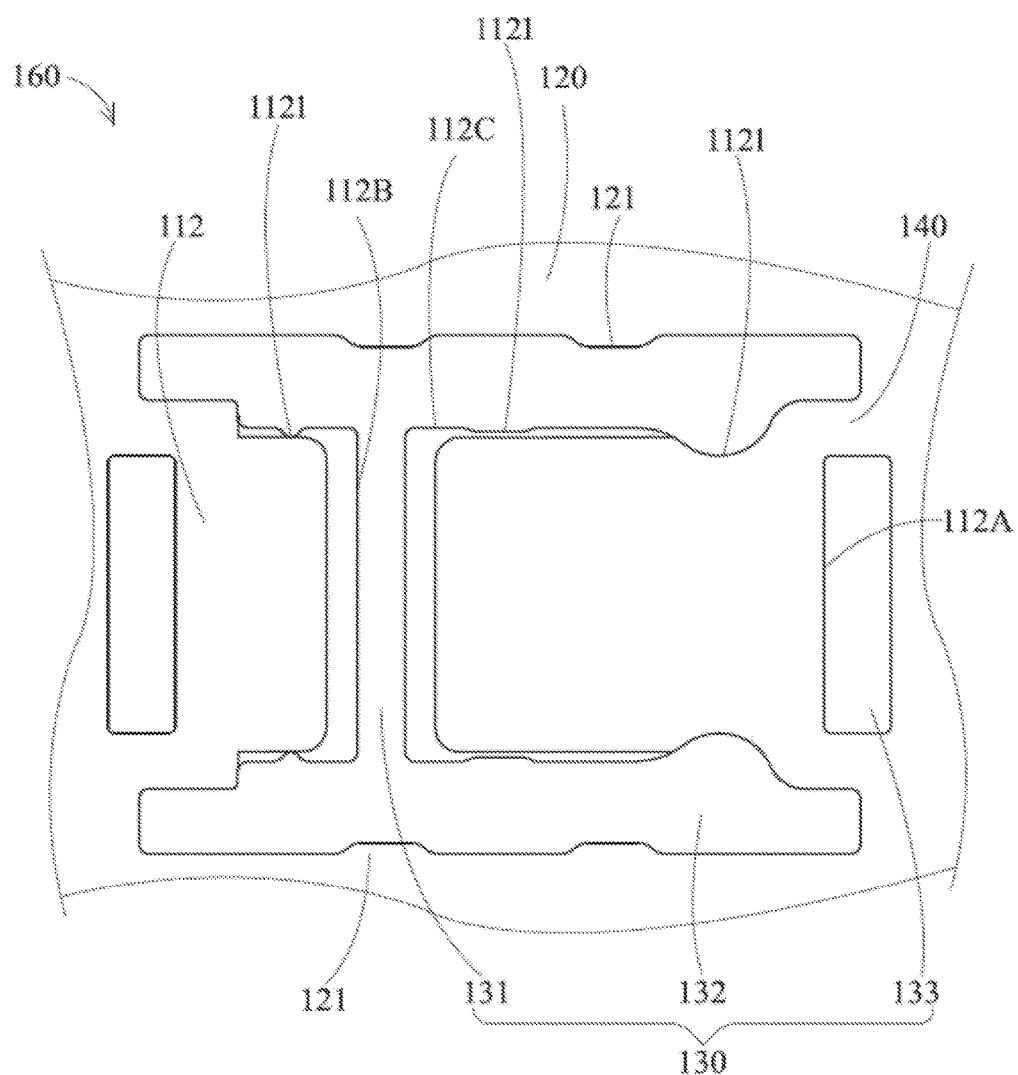
FIG. 13A to FIG. 16 are schematic views illustrating steps of a method for manufacturing a carrier leadframe according to an embodiment of the present disclosure.

The shape features of the electrode portions 112 will be further described. Referring to FIG. 13A, each of the two electrode portions 112 has a wing portion 112A and an inner side surface 112B that are disposed opposite to each other (i.e., disposed oppositely), the wing portion 112A may be exposed outside the housing cross section 111A of the housing 111 (reference may be made to the aforesaid relevant descriptions of FIG. 6 to FIG. 11) and does not face the wing portion 112A of another electrode portion 112. The inner side surfaces 112b of the two electrode portions 112 may face each other, and at least a part of the two electrode portions 112 may be covered by the housing 111.

Each of the two electrode portions 112 further comprises two connecting surfaces 112C disposed opposite to each other, and each of the connecting surfaces 112C connects the wing portion 112A with the inner side surface 112b. That is, an edge (e.g., a front edge) of the connecting surface 112C connects with an edge (i.e., a left edge) of the wing portion 112A, while another edge (e.g., a back edge) of the connecting surface 112C connects with an edge (i.e., a left edge) of the inner side surface 112b. The wing portion 112A, the inner side surface 112B and the two connecting surfaces 112C may not be flat surfaces. That is, the wing portion 112A, the inner side surface 112b and the two connecting surfaces 112C may be uneven or stepped surfaces.

Each of the two electrode portions 112 may further comprise at least one recess 1121, and the recess 1121 may be disposed on the connecting surface 112C so that the connecting surface 112C becomes an uneven surface. The recess 1121 can increase the contact area between the electrode portion 112 and the housing 111 (the plastic body 150) and strengthen the fastening effect between the electrode portion 112 and the housing 111 by virtue of the corresponding geometric relationships so that the binding force between the electrode portion 112 and the housing 111 is relatively strong. If there are a plurality of recesses 1121, the recesses 1121 may be sized differently according to different binding forces required at different positions between the electrode portion 112 and the housing 111.

The wing portion 112A, the inner side surface 112B and the two connecting surfaces 112C of the two electrode portions 112 may have the at least one void area 130 divided into a plurality of void areas 130, namely a gap 131, two first through grooves 132 and two second through grooves 133 in communication with each other. The gap 131 is disposed between the inner side surfaces 112b of the two electrode portions 112, and the two first through grooves 132 are disposed along the two connecting surfaces 112C of the two electrode portions 112. That is, one of the first through grooves 132 extends from an edge of one connecting surface 112C of one electrode portion 112 to an edge of one connecting surface 112C, which faces the same direction, of the other electrode portion 112. The two first through grooves 132 are spaced apart from each other.

The two second through grooves 133 are disposed along the wing portions 112A of the two electrode portions 112. That is, each of the second through grooves 133 extends only along the wing portion 112A of one of the electrode portions 112. The two second through grooves 133 are also spaced apart from each other.

Figure 12A:
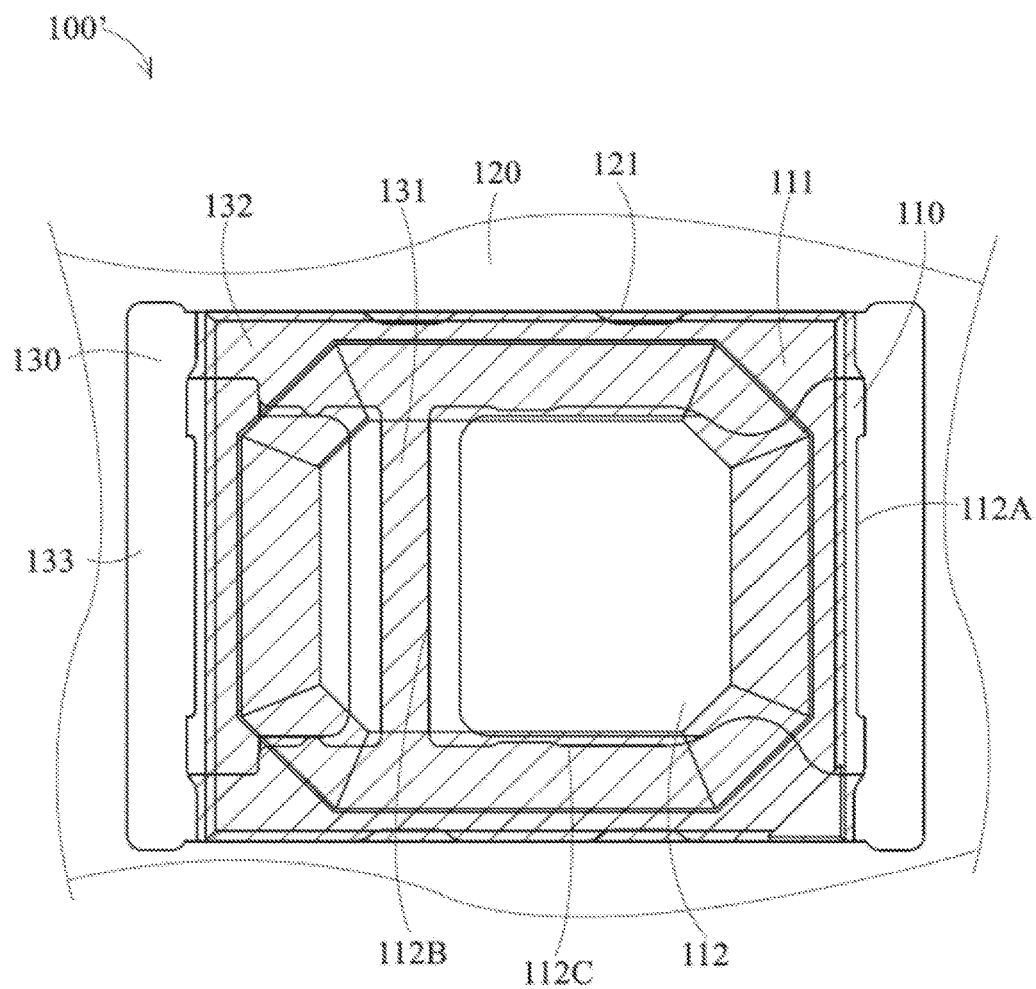
FIG. 12A to FIG. 12D are respectively a top view, a cross-sectional view taken along the front-to-back direction, a cross-sectional view taken along the left-to-right direction, and a partially enlarged view of a carrier leadframe according to an embodiment of the present disclosure.
Figure 12B:
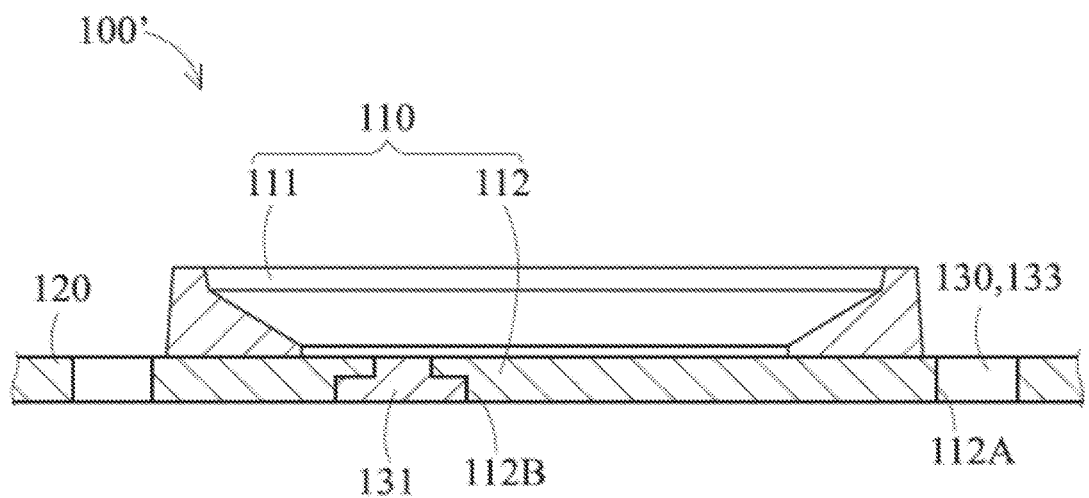
Figure 12C:
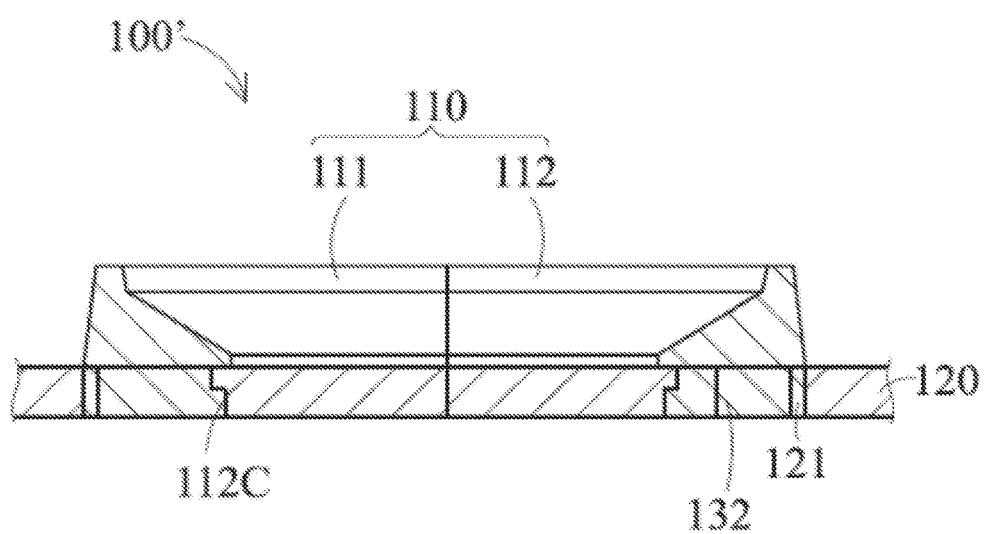
Figure 12D:
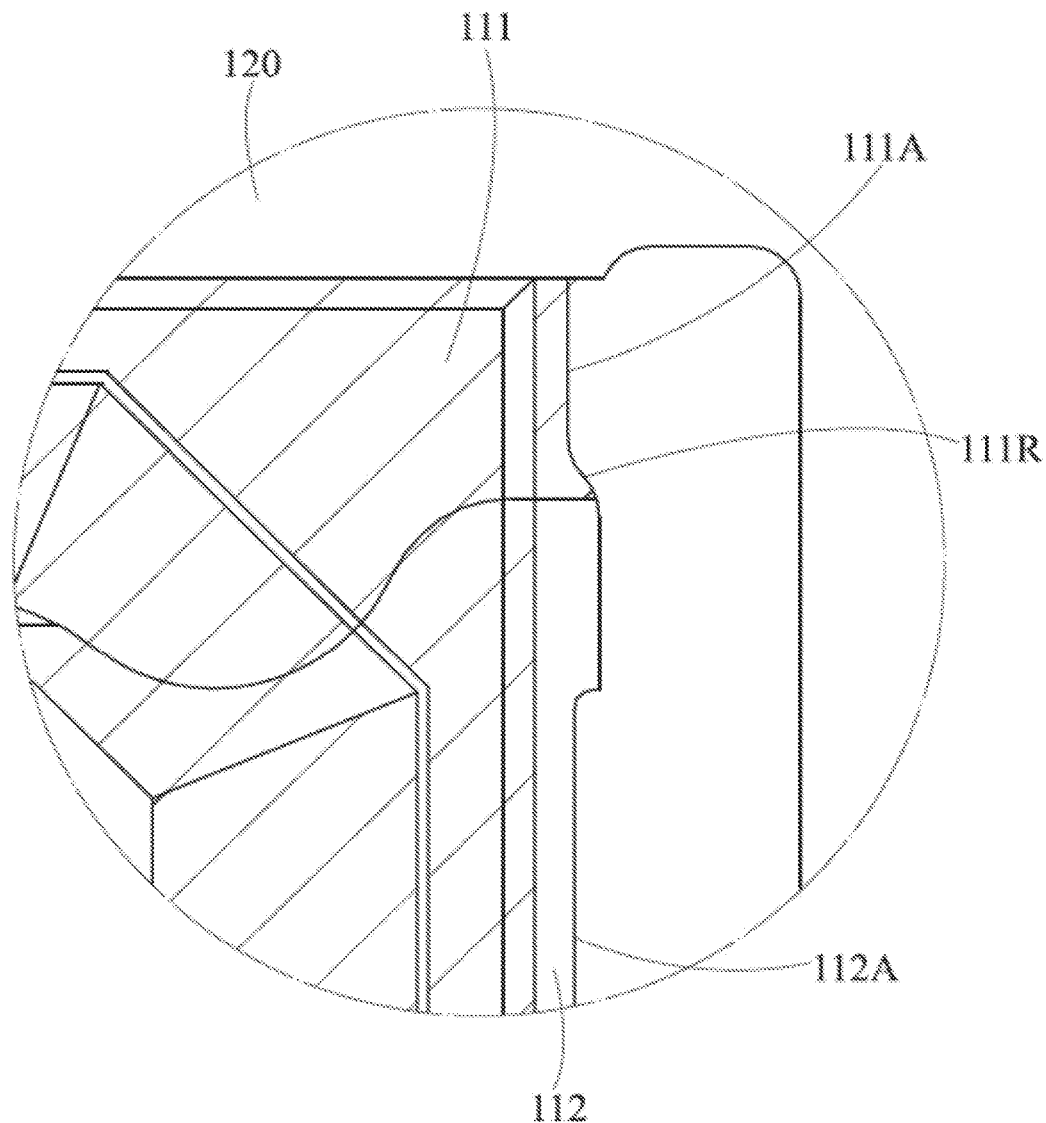

The supporting portion 121 of the frame body 120 may extend towards one of the two connecting surfaces 112C of the two electrode portions 112 into one of the two first through grooves 132. The housing 111 may be optionally disposed within the two first through grooves 132 and/or the gap 131. Additionally, the housing cross section 111A of the housing 111 may at least comprise a curved surface, e.g., may have a rounded corner 111R as shown in FIG. 12D. The housing cross section of the housing 111 has the rounded corner that is connected to the electrode portion cross section 112A2 of the electrode portion 112. The rounded corner 111R can disperse the impact force so that the rounded corner 111R is unlikely to be broken or cracked by the impact force during a vibration test of the singulated carrier 110. Moreover, in the embodiment as shown in FIG. 12D, the housing cross section and the electrode portion cross section do not form a flat surface, i.e., the housing cross section is not level with the electrode portion cross section.

According to the above descriptions, the carrier leadframe 100' can also allow the electrode portions 112 of the carriers 110 to be electrically isolated from each other. Thus, after the die bonding process, the wire bonding process and the encapsulation process are subsequently performed on the light emitting devices, the electric measurement can be directly performed on the light emitting devices that are not singulated, and this greatly improves the production speed of the light emitting devices. It shall be further appreciated that, the technical contents of the carrier leadframe 100' may also be used as a reference for the carrier leadframe 100.

An embodiment of the present disclosure further provides a method for manufacturing a carrier leadframe, which can at least manufacture the aforesaid carrier leadframe 100'. The method for manufacturing the carrier leadframe 100' is similar to the method for manufacturing the aforesaid carrier leadframe 100 and comprises the following steps.

Figure 13B:
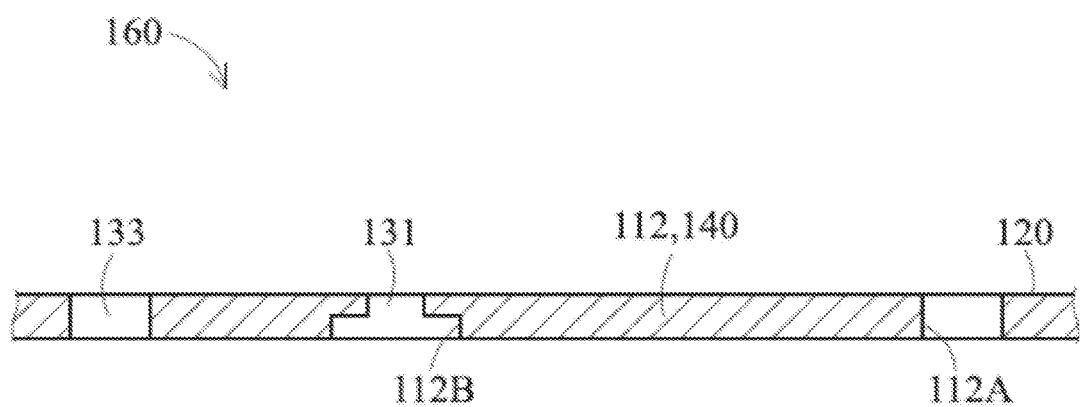
Figure 13C:
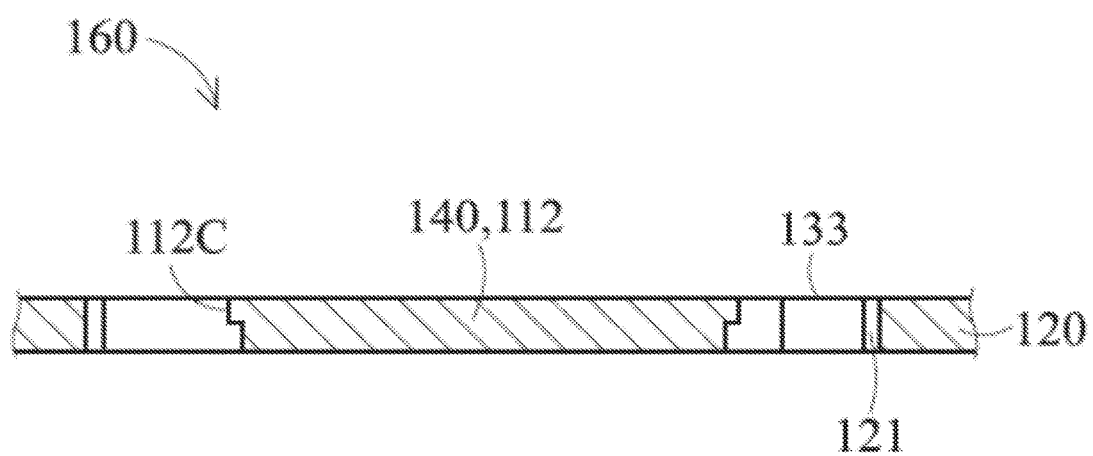

Referring to FIG. 13A to FIG. 13C, first a conductive sheet 160 is provided. The conductive sheet 160 comprises a frame body 120, and the frame body 120 comprises at least one supporting portion 121, at least one void area 130 and at least one extending portion 140. The at least one void area 130 may correspond to a gap 131, two first through grooves 132 and two second through grooves 133 of the carrier leadframe 100', but at this point, the two first through grooves 132 are not in communication with the two second through grooves 133 yet. The at least one extending portion 140 may correspond to the two electrode portions 112 of the carrier leadframe 100', but at this point, the two electrode portions 112 have not been separated from the frame body 120 yet.

Figure 14:
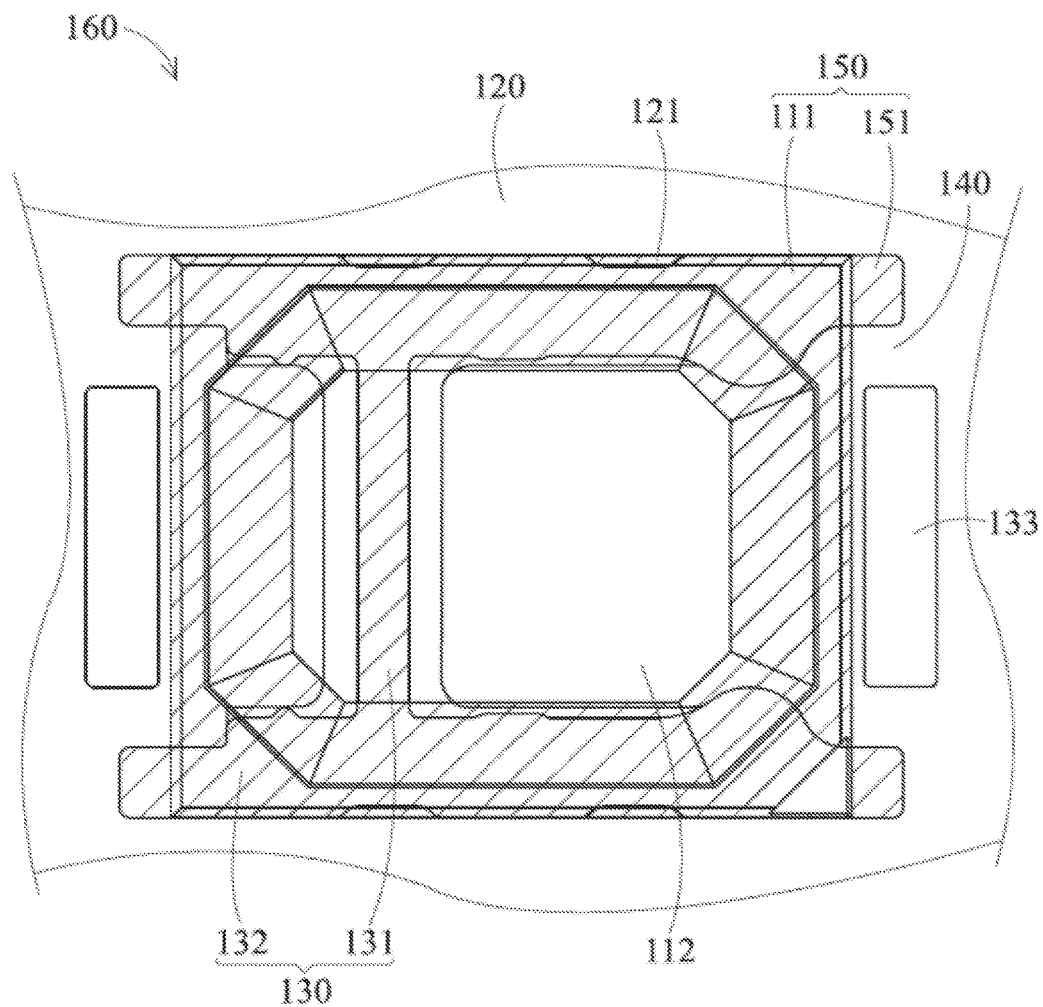

Referring to FIG. 14, then a plastic body 150 is formed in a second step. The plastic body 150 covers at least a part of the extending portion 140 and at least a part of the supporting portion 121, and the plastic body 150 fills at least a part of the void area 130. For example, the plastic body 150 covers a part of the two electrode portions 112 of the extending portion 140 and completely covers the supporting portion 121, and the plastic body 150 fills the gap 131 and the two first through grooves 132 of the void area 130 but does not fill the second through grooves 133 of the void area 130. Furthermore, the plastic body 150 may make contact with the recess 1121 (as shown in FIG. 13A) of the extending portion 140 so as to increase the contact area between the plastic body 150 and the extending portion 140.

Figure 15:
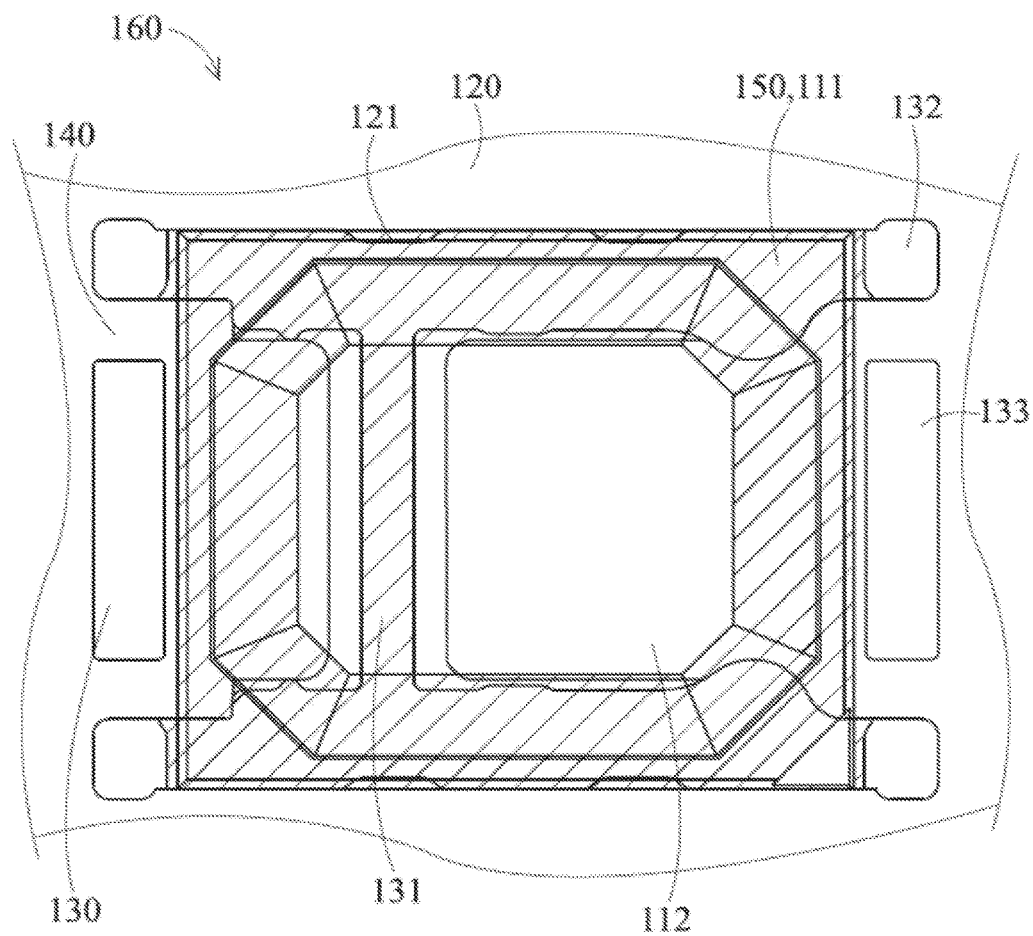

Referring to FIG. 15, part of the plastic body 150 filled in the void area 130 is removed in a third step. That is, part of the plastic body 150 filled in the two first through grooves 132 is removed. The plastic body 150 to be removed is called the residual material 151 (as shown in FIG. 14), and the scope of the residual material 151 is defined depending on the specific shape of the product. In this embodiment, the plastic body 150 filled in two end areas of the two first through grooves 132 is removed so that convex corners at four corners of the plastic body 150 are removed. The remaining plastic body 150 forms the housing 111 of the carrier leadframe 100'.

Figure 16:
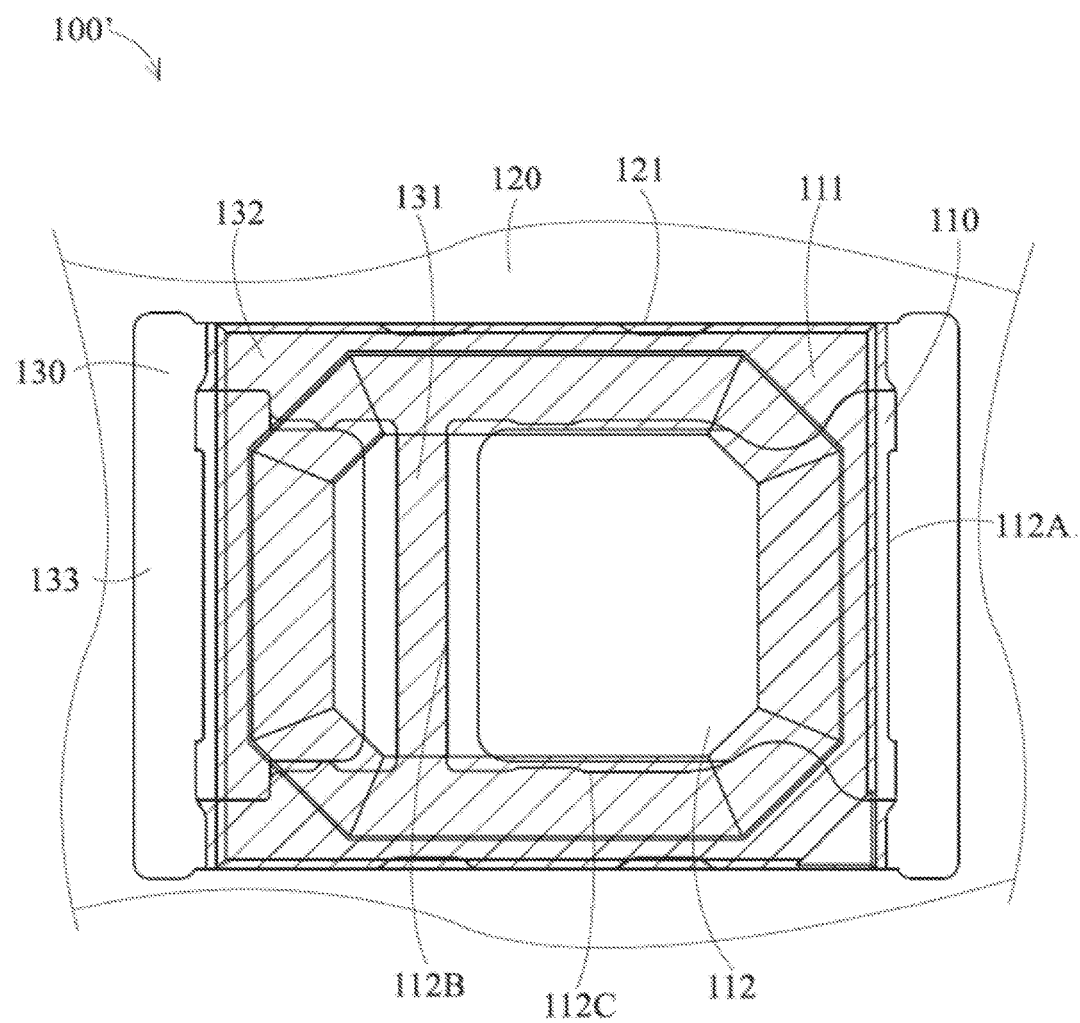

Referring to FIG. 16, the part of the extending portion 140 exposed outside the plastic body 150 is removed in a fourth step so that the remaining extending portion 140 is separated from the frame body 120. In other words, the part of the extending portion 140 at two sides of the second through groove 133 (as shown in FIG. 15) will be removed in this step so that the second through groove 133 is in communication with the first through groove 132. The remaining extending portion 140 forms the electrode portions 112 of the carrier leadframe 100'.

After the aforesaid steps, the carrier leadframe 100' is formed. For detailed technical contents of the aforesaid steps, reference may be made to the method for manufacturing the carrier leadframe 100. For example, a conductive layer may be firstly formed on the conductive sheet 160, the third step and the fourth step may be swapped with each other, and the plastic body 150 may be cleaned before the fourth step.

Referring to FIG. 17A to FIG. 17D, schematic views (i.e., a top view, a cross-sectional view taken along the front-to-back direction, a cross-sectional view taken along the left-to-right direction, and a partially enlarged view) of a carrier leadframe 100" according to an embodiment of the present disclosure are shown therein, where more than one carrier leadframe 100" are shown.

Figure 17A:
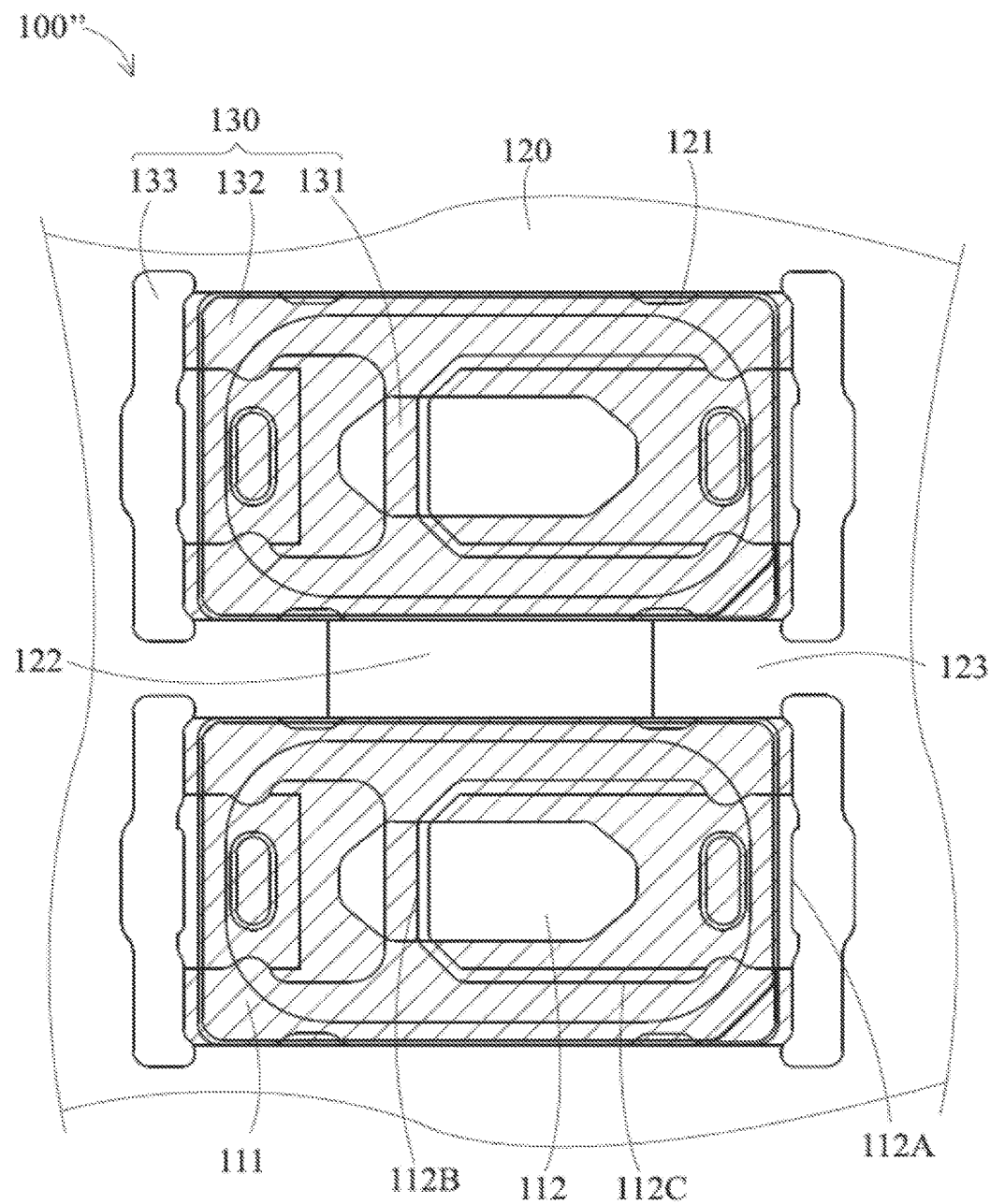
FIG. 17A to FIG. 17D are respectively a top view, a cross-sectional view taken along the front-to-back direction, a cross-sectional view taken along the left-to-right direction, and a partially enlarged view of a carrier leadframe according to an embodiment of the present disclosure.
Figure 17B:
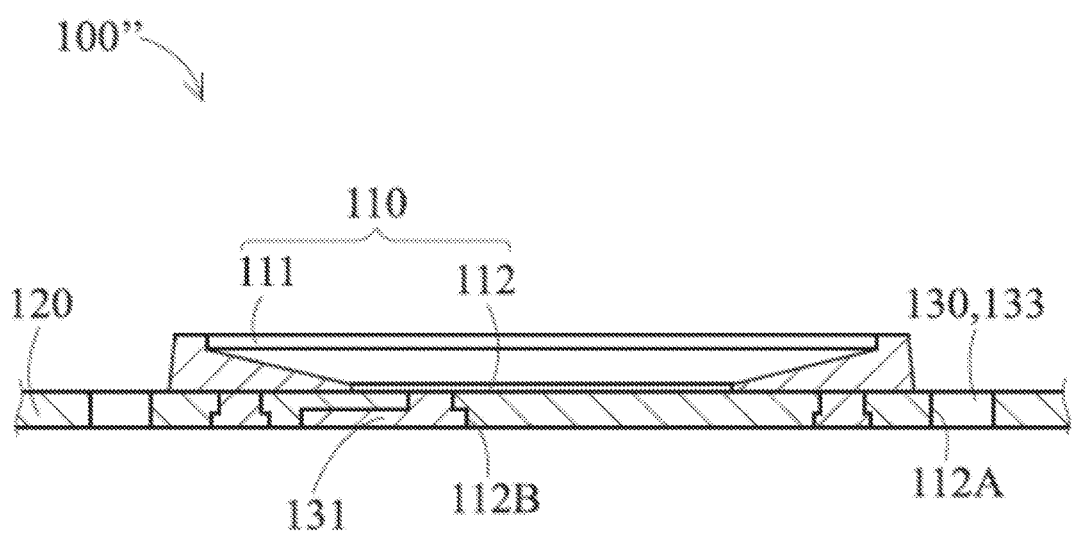
Figure 17C:
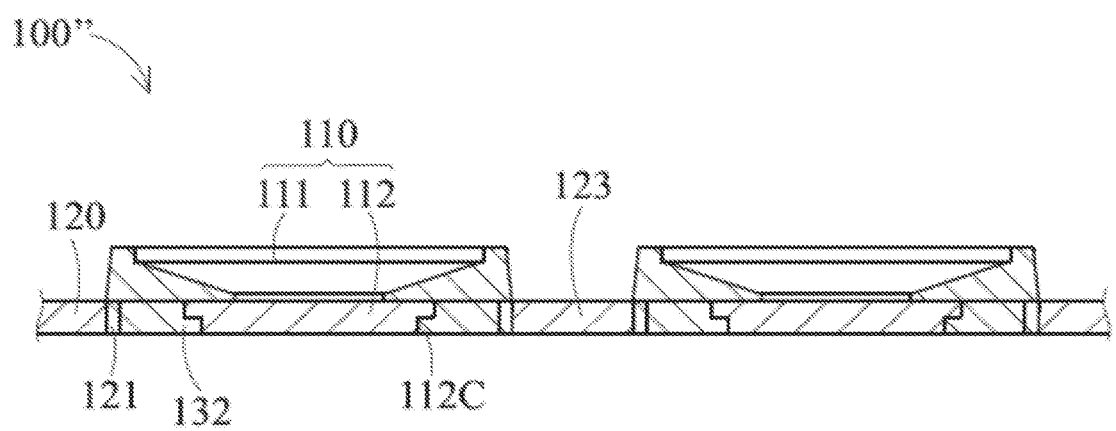
Figure 17D:
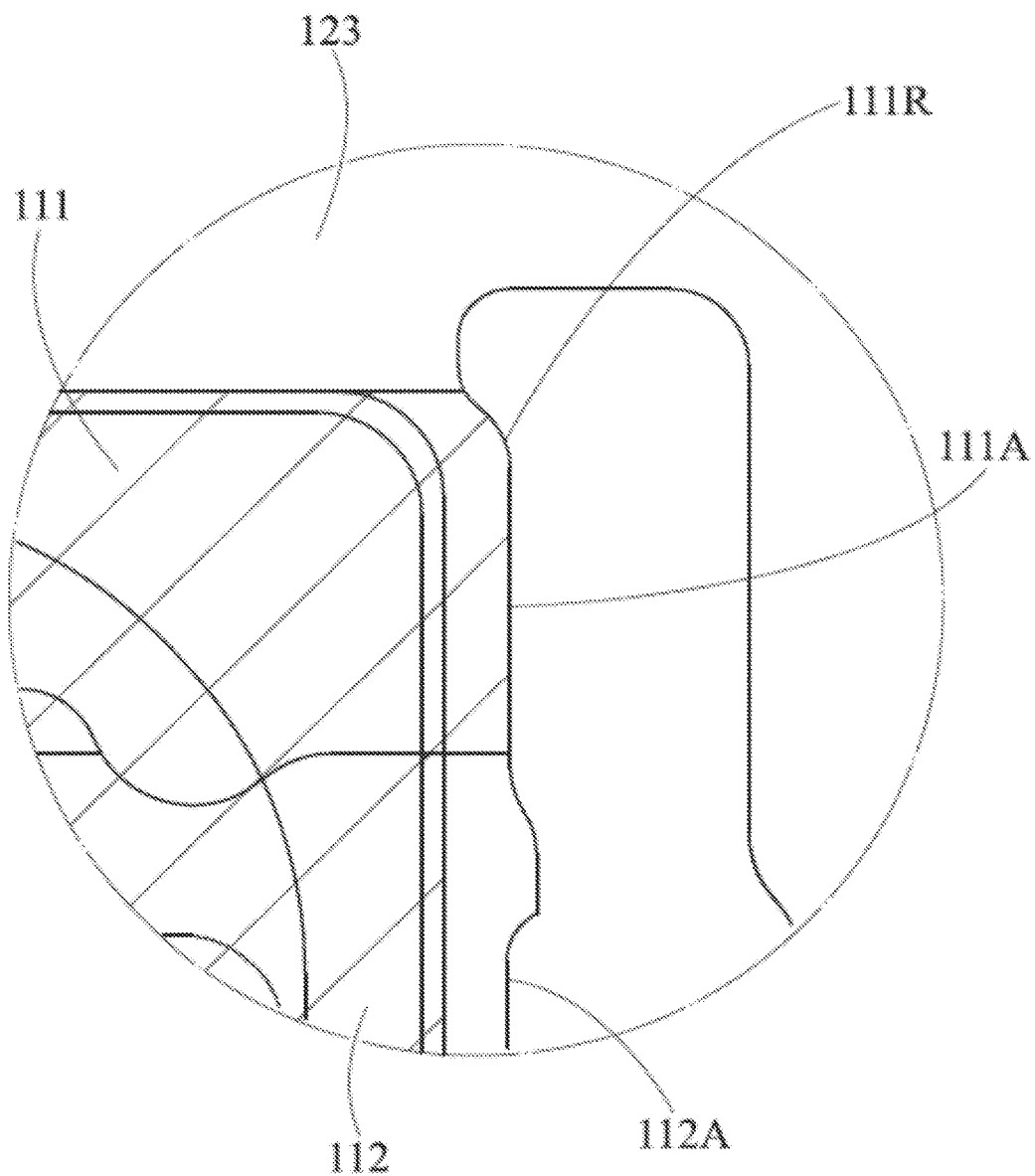

The carrier leadframe 100" is similar to the aforesaid carrier leadframes 100 and 100', so reference may be made to each other for the technical contents of the carrier leadframes 100", 100, and 100'. However, it shall be appreciated that, the frame body 120 of the carrier leadframe 100" has a side portion 123 and a runner area 122, and the side portion 123 may be commonly owned by the leadframes 120 of two carrier leadframes 100". In other words, the frame body 120 of the two carrier leadframes 100" may be formed integrally via the commonly owned side portion 123. Moreover, the carriers 110 of the two carrier leadframes 100" are separated from each other by the side portion 123. The runner area 122 is disposed in the side portion 123 and is in communication with one of the two first through grooves 132 of each carrier leadframe 100". It shall be further appreciated that, the housing cross section 111A of the housing 111 may at least comprise a curved surface, e.g., may have a rounded corner 111R, and the rounded corner 111R is connected to the side portion 123 of the frame body 120. Additionally, the electrode portion cross section of the electrode portion 112 may also at least comprise a curved surface, and the aforesaid curved surfaces are not limited to a single curvature. That is, the outline of the edge areas of the electrode portion 112 is a curved line. The electrode portion cross section is not adjacent to the rounded corner 111R. The impact force can be dispersed due to the curved cross section. Meanwhile, in the embodiment as shown in FIG. 17D, the housing cross section and the electrode portion cross section do not form a flat surface, i.e., the housing cross section is not level with the electrode portion cross section.

In terms of the effect, the carrier leadframe 100" can also allow the electrode portions 112 of the carriers 110 to be electrically isolated from each other. Thus, after the die bonding process, the wire bonding process and the encapsulation process are subsequently performed on the light emitting devices, the electric measurement can be directly performed on the light emitting devices that are not singulated, and this greatly improves the production speed of the light emitting devices.

An embodiment of the present disclosure further provides a method for manufacturing a carrier leadframe, which can at least manufacture the aforesaid carrier leadframe 100". The method for manufacturing the carrier leadframe 100" is similar to the method for manufacturing the carrier leadframe 100', so identical descriptions will be omitted or simplified. The method for manufacturing the carrier leadframe 100" may comprise the following steps.

Figure 18A:
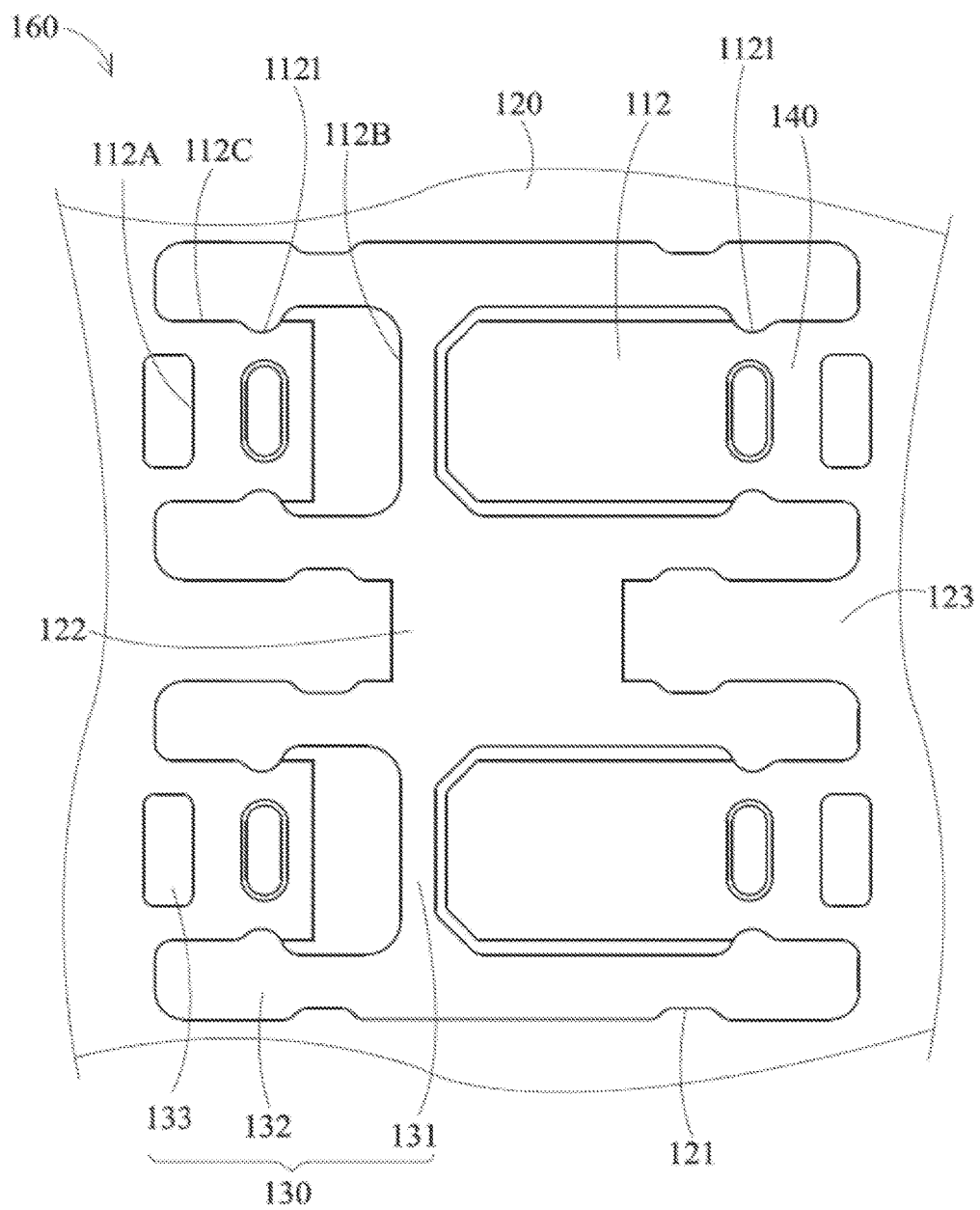
FIG. 18A to FIG. 22 are schematic views illustrating steps of a method for manufacturing a carrier leadframe according to an embodiment of the present disclosure.
Figure 18B:
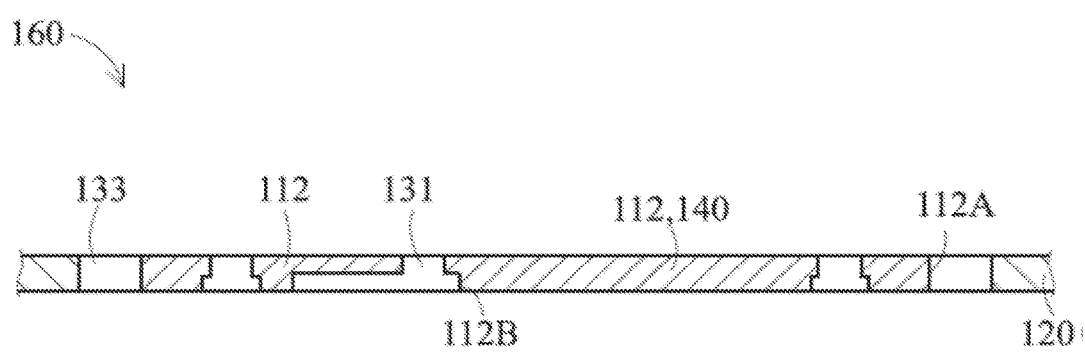
Figure 18C:
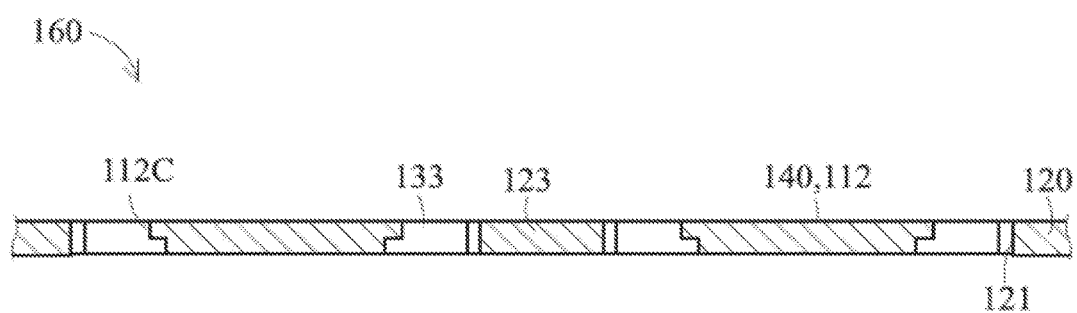

Referring to FIG. 18A to FIG. 18C, first a conductive sheet 160 is provided. Two conductive sheets 160 are provided in this embodiment as an example. Each of the conductive sheets 160 comprises at least one frame body 120, and the frame body 120 comprises at least one supporting portion 121, at least one side portion 123, at least one runner area 122, at least one void area 130 and at least one extending portion 140. The runner area 122 is disposed on the side portion 123 and is in communication with the void area 130.

Figure 19:
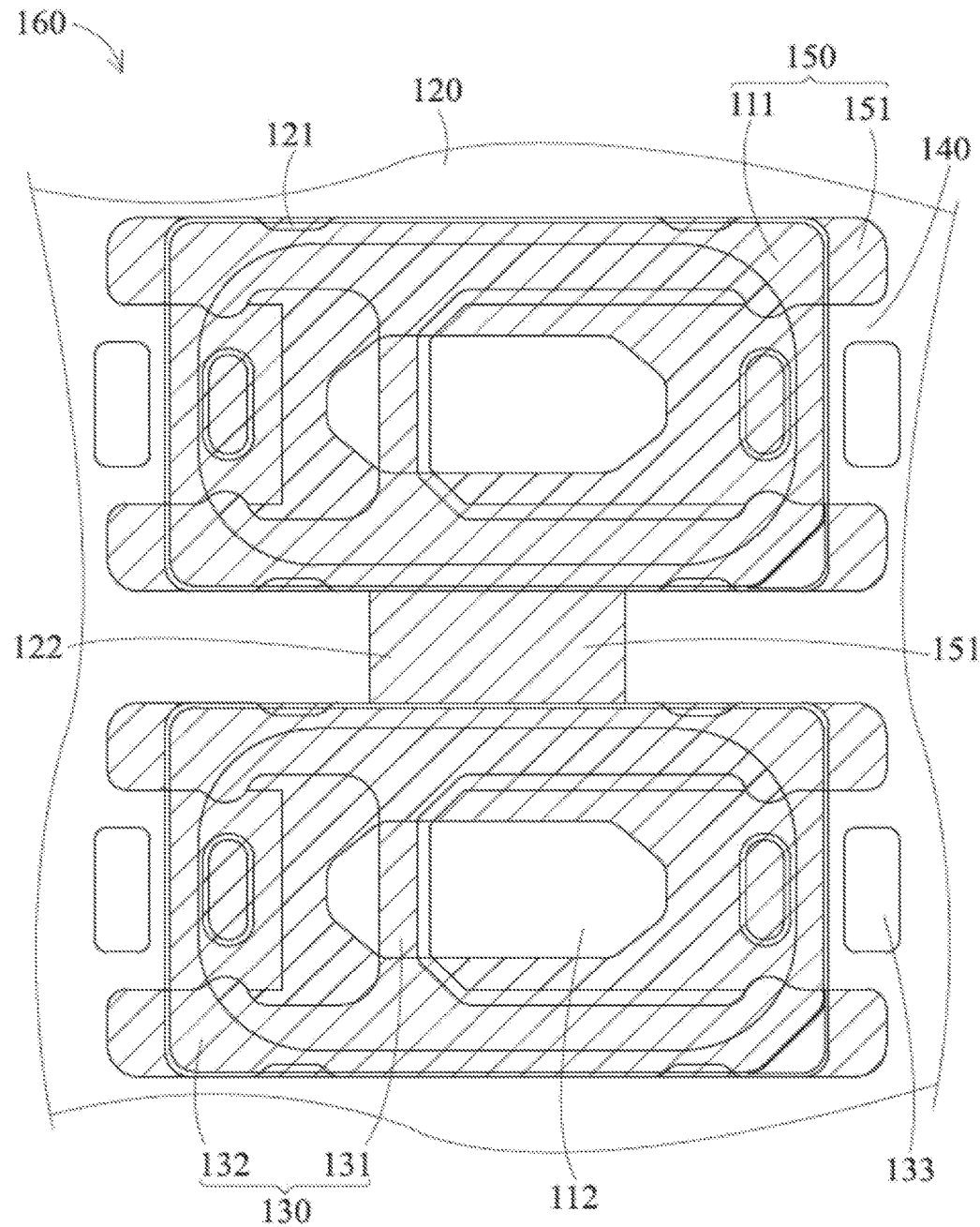

Referring to FIG. 19, then a plastic body 150 is formed in a second step. The plastic body 150 covers at least a part of the extending portion 140 and at least a part of the supporting portion 121 of each conductive sheet 160, and the plastic body 150 fills at least a part of the void area 130. The plastic body 150 also fills the runner area 122; that is, the plastic body 150 passes through the runner area 122 to cover another conductive sheet 160. Moreover, the plastic body 150 makes contact with the recess 1121 (as shown in FIG. 18A) of the extending portion 140 to increase the contact area between the plastic body 150 and the extending portion 140.

Figure 20:
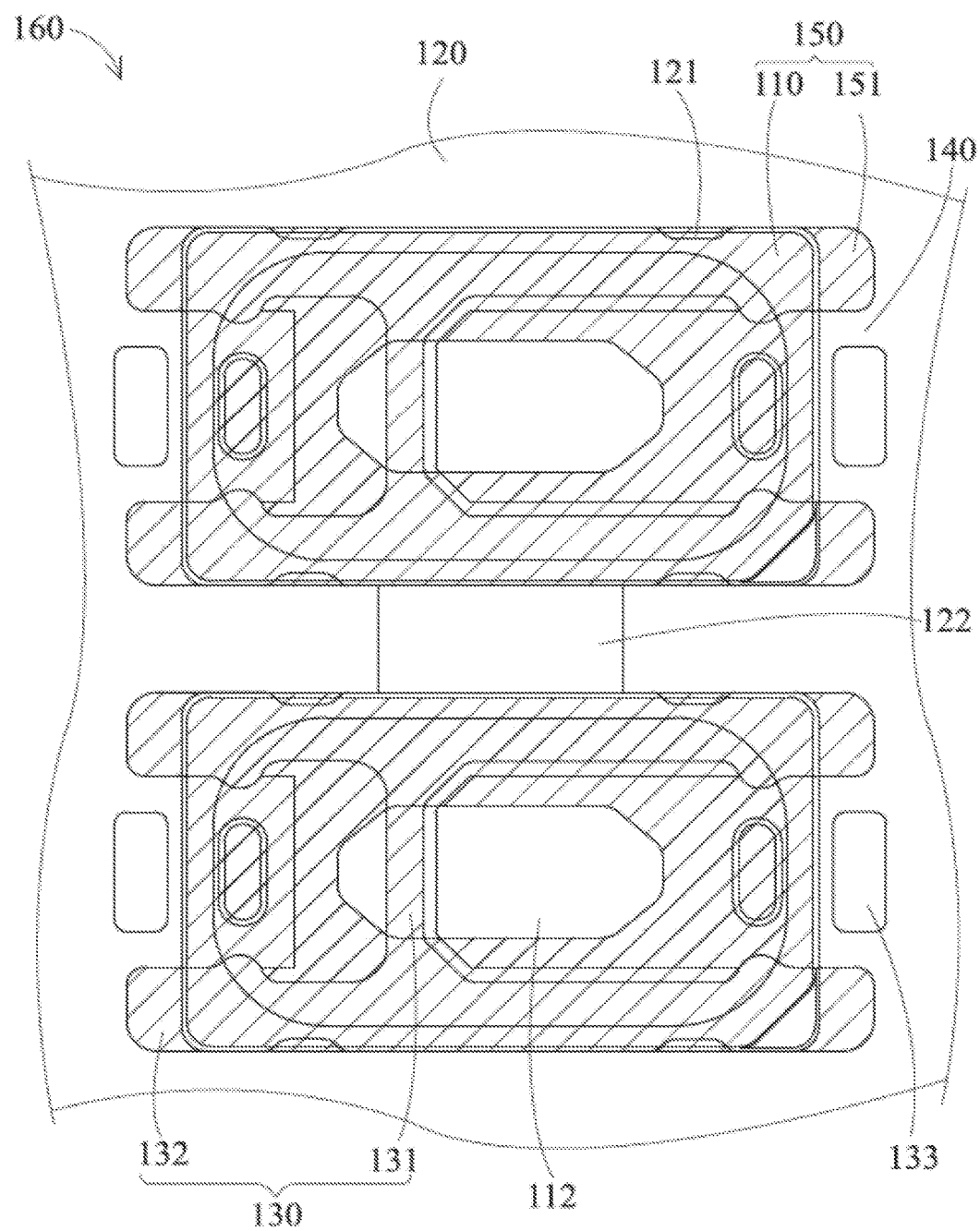

Referring to FIG. 20, the plastic body 150 within the runner area 122 is removed in a third step. The plastic body 150 can be removed in one step or in several steps. Specifically, if the plastic body 150 is to be removed in one step, then a knife of a length larger than that of the runner area 122 will be used to remove the part of the frame body 120 at the two sides of the runner area 122 as well as the plastic body 150 within the runner area 122 together. Thus, after the plastic body 150 within the runner area 122 is removed, the runner area 122 will be slightly elongated.

If the plastic body 150 is to be removed in several steps, then first a knife of a length slightly smaller than that of the runner area 122 will be used to remove part of the plastic body 150 within the runner area 122, and then another knife is used to scrape off the remaining plastic body 150 within the runner area 122.

Figure 21:
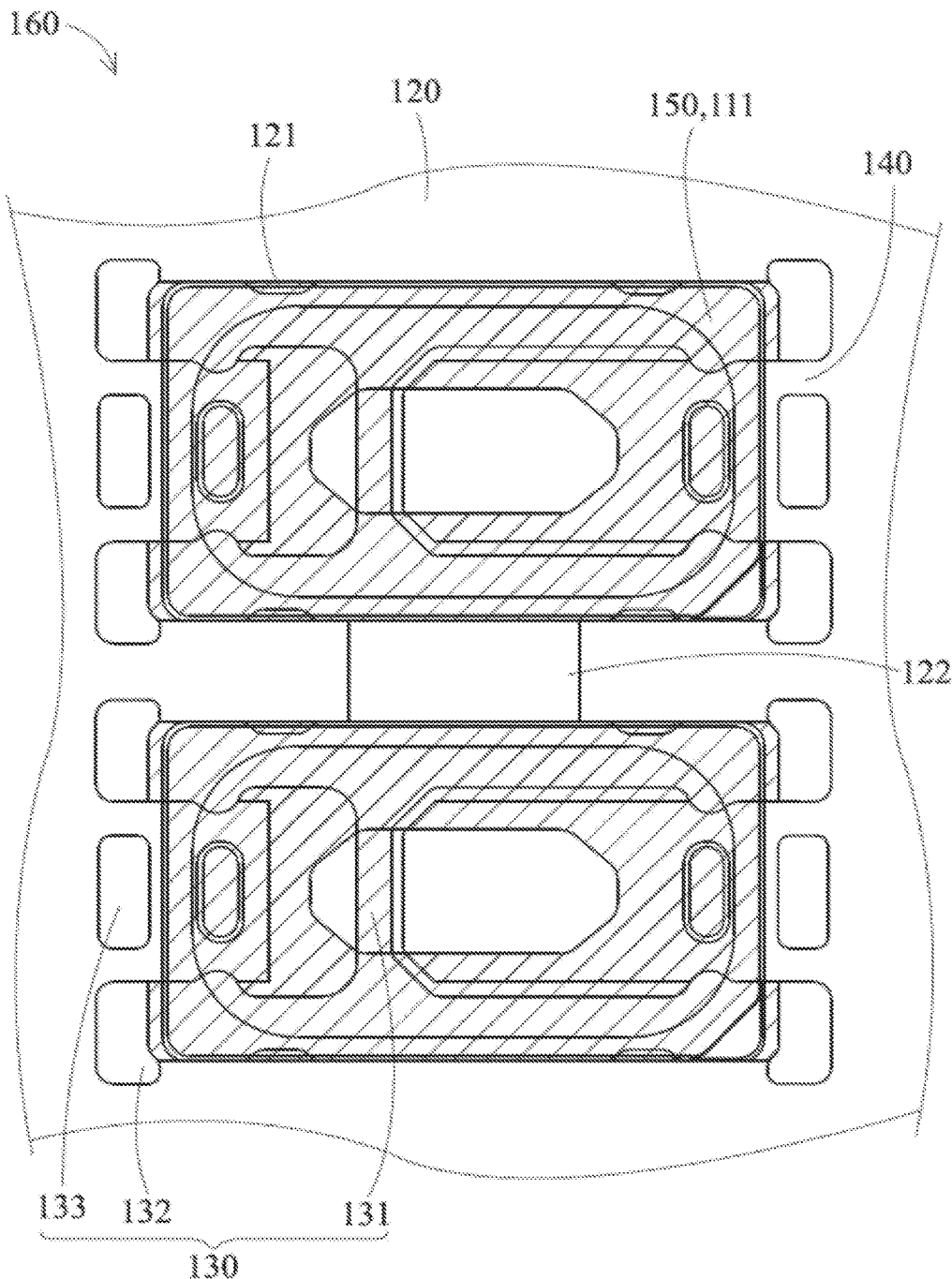

Referring to FIG. 21, part of the plastic body 150 filled within the void area 130 is removed in a fourth step. That is, part of the plastic body 150 filled within the two first through grooves 132 (e.g., the residual material 151 at the four corners as shown in FIG. 20) is removed. After the third and the fourth steps, the remaining plastic body 150 that is not removed forms the housing 111 of the carrier leadframe 100".

Figure 22:
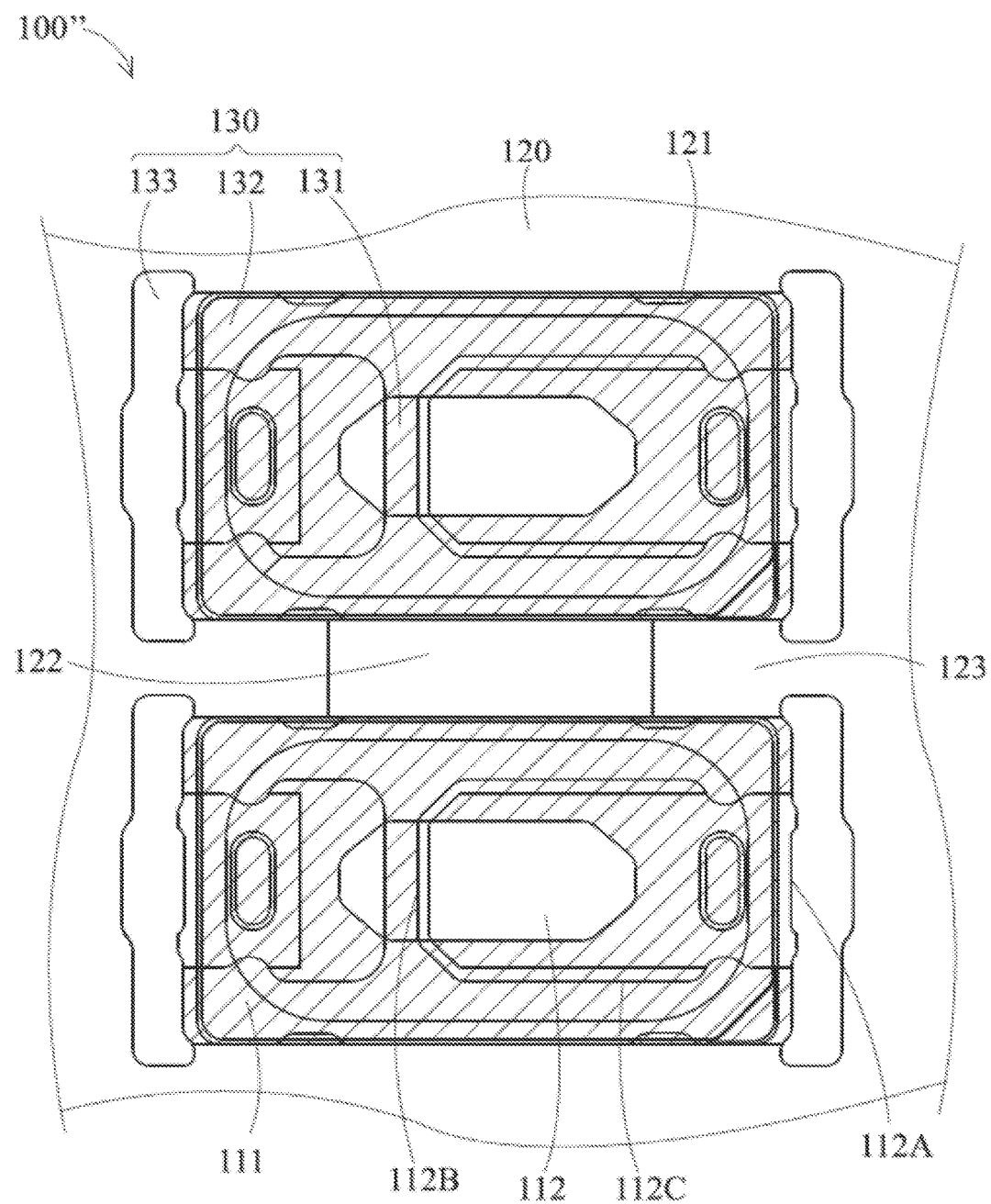

Referring to FIG. 22, the part of the extending portion 140 exposed outside the plastic body 150 (as shown in FIG. 21) is removed in a fifth step so that the remaining extending portion 140 is separated from the frame body 120. In other words, the part of the extending portion 140 at the two sides of the second through groove 133 will be removed in this step so that the second through groove 133 is in communication with the first through groove 132. The remaining extending portion 140 forms the electrode portions 112 of the carrier leadframe 100".

After the aforesaid steps, the carrier leadframe 100" is formed. It shall be noted that, the order in which the third step to the fifth step are executed is not limited, but can be swapped with each other.

The above description is related to the detailed technical contents and inventive features thereof. People skilled in this field may proceed with a variety of modifications and replacements based on the description and suggestions of the present disclosure as described without departing from the characteristics thereof. Nevertheless, although such modifications and replacements are not fully disclosed in the above descriptions, they have substantially been covered in the following claims as appended.

What is claimed is:

1. A light emitting device, comprising: a carrier; a light emitting diode (LED) chip carried within the carrier; and an encapsulant covering the LED chip, wherein the carrier comprises: at least one electrode portion, each of the at least one electrode portion comprising at least an electrode portion cross section; and a housing comprising a housing cross section, the housing at least partially covering the at least one electrode portion, wherein the housing cross section and the electrode portion cross section are not level with one another; wherein each of the at least one electrode portion further comprises a central area and two edge areas, and wherein the electrode portion cross section is located on at least one of the two edge areas; wherein the central area and the two edge areas protrude from the housing cross section; wherein the central area protrudes from the two edge areas.

2. The light emitting device of claim 1, wherein the electrode portion cross section comprises a sloping surface.

3. The light emitting device of claim 1, wherein the electrode portion cross section and the central area are not coplanar.

4. The light emitting device of claim 1, wherein the housing cross section or the electrode portion cross section comprises a curved surface.

5. The light emitting device of claim 1, wherein the housing cross section comprises a rounded corner.

6. The light emitting device of claim 1, wherein the housing cross section and the electrode portion cross section form a continuous convex curved surface.

7. The light emitting device of claim 1, wherein the at least one electrode portion comprises an antioxidant layer, and wherein the electrode portion cross section comprises a cross section uncovered by the antioxidant layer.

8. The light emitting device of claim 1, wherein the two edge areas protrude from the central area.

9. The light emitting device of claim 8, wherein the at least one electrode portion comprises two electrode portion cross sections respectively located on the two edge areas.

10. The light emitting device of claim 8, wherein the electrode portion cross section comprises a curved surface.

11. The light emitting device of claim 10, wherein the curved surface comprises a concave curved surface.

12. The light emitting device of claim 8, wherein one of the two edge areas and the housing cross section form a continuous surface.

* * * * *